United States Patent
Yasuda et al.

(10) Patent No.: US 7,184,297 B2
(45) Date of Patent: Feb. 27, 2007

(54) SEMICONDUCTOR MEMORY DEVICE

(75) Inventors: Shinichi Yasuda, Yokohama (JP); Keiko Abe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 77 days.

(21) Appl. No.: 11/165,404

(22) Filed: Jun. 24, 2005

(65) Prior Publication Data

US 2006/0023488 A1    Feb. 2, 2006

(30) Foreign Application Priority Data

Jul. 30, 2004    (JP)    ............... 2004-223731

(51) Int. Cl.
- G11C 11/00 (2006.01)
- G11C 27/00 (2006.01)
- G11C 5/06 (2006.01)
- G11C 11/34 (2006.01)

(52) U.S. Cl. .................. 365/148; 365/46; 365/72; 365/163; 365/182

(58) Field of Classification Search ........... 365/46, 365/148, 163, 182
See application file for complete search history.

(56) References Cited

U.S. PATENT DOCUMENTS

| | | | | |
|---|---|---|---|---|
| 7,123,535 | B2 * | 10/2006 | Kurotsuchi et al. | 365/225.7 |
| 2006/0098473 | A1 * | 5/2006 | Yasuda | 365/148 |

FOREIGN PATENT DOCUMENTS

JP    2003-323791    11/2003

OTHER PUBLICATIONS

T. Sakamoto et al., "Reproducible Current Switching in Copper Sulfide Films", Extended Abstracts of the 2002 International Conference on Solid State Devices and Materials, Nagoya, (2002), pp. 264-265.

T. Sakamoto et al., "A Nonvolatile Programmable Solid Electrolyte Nanometer Switch", 2004 IEEE International Solid-State Circuits Conference, Session 16, TD: Emerging Technologies and Circuits, 16.3, (Jun. 2004), 10 sheets.

* cited by examiner

*Primary Examiner*—Amir Zarabian
*Assistant Examiner*—Ly Duy Pham
(74) *Attorney, Agent, or Firm*—Finnegan, Henderson, Farabow, Garrett & Dunner, L.L.P.

(57) ABSTRACT

A semiconductor memory includes: a first node and a second node; a first MIS transistor, having first conductive carrier flows, including a source electrode connected to a first power supply, a drain electrode connected to the second node, and a gate electrode connected to the first node; a second MIS transistor, having second conductive carrier flows, including a source electrode connected to a second power supply, a drain electrode connected to the second node, and a gate electrode connected to the first node; and a resistance change element connected between the first node and the second node and having a variable resistance due to the direction in which a voltage is applied, wherein information is written in the resistance change element by applying a voltage between the first and the second node, and stored information is read out by applying a low or high input voltage to the first node and reading out a voltage difference in the second node.

20 Claims, 13 Drawing Sheets

SEMICONDUCTOR MEMORY DEVICE

CROSS REFERENCE TO RELATED APPLICATIONS AND INCORPORATION BY REFERENCE

This application is based upon and claims the benefit of priority from prior Japanese Patent Applications P2004-223731 filed on Jul. 30, 2004; the entire contents of which are incorporated by reference herein.

BACKGROUND OF THE INVENTION

1. Field of the Invention

The present invention relates to a semiconductor memory device. More specifically, it relates to a semiconductor memory device characterized by a resistance change element, which varies in resistance due to the direction in which a voltage is applied, and a read-out circuit and a write-in circuit configured with a common small circuit.

2. Description of the Related Art

Elements capable of changing their own resistances and thereby providing two or more resistance values have been suggested. A magneto resistive random access memory (MRAM) having a magnetic tunnel junction (MTJ) device functions based on spin of the material, a chalcogenide such as $Ge_2Sb_2Te_5$ in which phase change can be utilized, a solid electrolyte such as $Cu_2S$ or Ag-rich Ag—Ge—Se based chalcogenide in which ionic conduction is utilized, a device that has an organic material such as a metallic layer sandwiched between insulating films, or Rotaxane or other molecular materials, or a colossal magneto resistive (CMR) material such as $Pr_{0.7}Ca_{0.3}MnO_3$, and a device having an oxide have been suggested for such elements. The above materials can function as a memory element by assigning data to respective differing resistances.

Utilization of ionic conduction in a solid electrolyte such as $Cu_2S$ has been disclosed in, for example, "REPRODUCIBLE CURRENT SWITCHING IN COPPER SULFIDE FILMS", written by T. Sakamoto, et. al, Extended Abstract of the 2002 International Conference on Solid State Devices and Materials, Nagoya, 2002, p. 264–265, and 'A NON-VOLATILE PROGRAMMABLE SOLID ELECTROLYTE NANOMETER. SWITCH', written by T. Sakamoto, et. al, 2004 IEEE International Solid-state Circuits Conference, session 16, TD: Emerging Technologies and Circuits, 16.3.

Resistance change elements other than MTJ elements serve as two-terminal elements. The difference in resistance of some resistance change elements is based on the direction in which voltage is applied. Since resistance change elements are two-terminal elements, those elements can be densely formed. In addition, usage of a material other than silicon for those resistance change elements allows formation of elements in an interconnect layer. This may allow reduction of the entire circuit area.

On the other hand, since each of those resistance change elements have two terminals, a method of reading a current value flowing through an element as a voltage is applied is conventionally used as an information read-out method. For example, a method of reading out the resistances of elements in a memory cell array, which is arranged at respective cross-points, using a charge-injection sense amplifier has been disclosed in Japanese Patent Application Laid-Open No. 2003-323791. However, typically, such circuit is relatively large. In addition, since such circuit is a read-only circuit, a write-in circuit must be provided independently. This creates a problem that the circuit increases in size.

The present invention allows configuration of a small circuit commonly used as a read-out circuit and a write-in circuit of a semiconductor memory device, which includes a resistance change element that varies in resistance due to the direction in which a voltage applied.

SUMMARY OF THE INVENTION

An aspect of the present invention inheres in a semiconductor memory which includes: a first node and a second node; a first MIS transistor, having first conductive carrier flows, including a source electrode connected to a first power supply, a drain electrode connected to the second node, and a gate electrode connected to the first node; a second MIS transistor, having second conductive carrier flows, including a source electrode connected to a second power supply, a drain electrode connected to the second node, and a gate electrode connected to the first node; and a resistance change element connected between the first node and the second node and having a variable resistance due to the direction in which a voltage is applied, wherein information is written in the resistance change element by applying a voltage between the first and the second node, and stored information is read out by applying a low or high input voltage to the first node and reading out a voltage difference in the second node.

Another aspect of the present invention inheres in a semiconductor memory which includes: a first node and a second node; a first MIS transistor, having first conductive carrier flows, including a source electrode connected to a first power supply, a drain electrode connected to the second node, and a gate electrode connected to the first node; a second MIS transistor, having second conductive carrier flows, including a source electrode connected to a second power supply, a drain electrode connected to the second node, and a gate electrode connected to the first node; a plurality of resistance change element connected between the first node and the second node and having a variable resistance due to the direction in which a voltage is applied; and a plurality of select transistors disposed between the first node and the second node and connected in series with the plurality of resistance change elements, respectively, wherein information is written in the resistance change element by applying a voltage between the first and the second node, and stored information is read out by applying a low or high input voltage to the first node and reading out a voltage difference in the second node.

Another aspect of the present invention inheres in a semiconductor memory which includes: a first node, a second node, and a switching node; a first MIS transistor, having first conductive carrier flows, including a source electrode connected to a first power supply, and a gate electrode connected to the first node; a second MIS transistor, having second conductive carrier flows, including a source electrode connected to a second power supply, and a gate electrode connected to the first node; a third MIS transistor, having first conductive carrier flows, having electrodes, one of which is connected to a drain electrode of the second MIS transistor, and another electrode connected to the second node, and a gate electrode connected to the switching node; a fourth MIS transistor, having second conductive carrier flows, having electrodes, one of which is connected to a drain electrode of the first MIS transistor and another electrode connected to the second node, and a gate electrode connected to the switching node; and a resistance change element connected between the first node and the second node and having a variable resistance due to the direction in which a voltage is applied, wherein information is written in the resistance change element by applying a voltage between the first and the second node, and stored information is read out by applying a low or high input voltage to the first node and reading out a voltage difference in the second node.

DETAILED DESCRIPTION OF THE INVENTION

Figure 1:
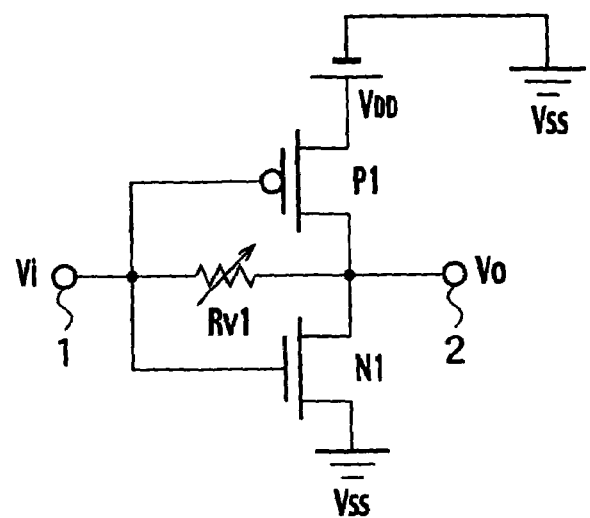
FIG. 1 shows a basic circuit structure of a semiconductor memory device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Referring to the drawings, embodiments of the present invention are described below. The same or similar reference numerals are attached to identical or similar parts among the following drawings. The embodiments shown below exemplify a circuit that is used to implement the technical ideas according to the present invention, and do not limit the technical ideas according to the present invention to those that appear below. These technical ideas, according to the present invention, may receive a variety of modifications that fall within the claims.

Next, the first and the second embodiment of the present invention are described forthwith while referencing the drawings. The same or similar symbols are given to the same or similar parts throughout the appended drawings. In addition, the first and the second embodiment given forthwith exemplifies devices and methods for embodying the technical ideas of the present invention, and those technical ideas of the present invention are not limited to the following materials, circuits, arrangements or the like. The technical ideas of the present invention may be modified into various modifications within the scope of the appended claims.

In the first and the second embodiment of the present invention, a semiconductor memory device having a CMOS inverter structure where a first, conductive-channel transistor and a second conductive-channel transistor are included is described. Here, if the first conductive type is a n-type, the first conductive-channel transistor refers to an n-channel transistor. In this case, the second conductive type is a p-type, that is, the second conductive-channel transistor refers to a p-channel transistor. On the other hand, if the first conductive type is a p-type, the second conductive type is a n-type. Complementary first conductive-channel input transistor and second conductive-channel output transistor have a structure where the respective drain electrodes thereof are electrically connected. Either one of those transistors is off in a steady state.

Typically, in the CMOS inverter, the source electrode of a p-channel MOS (hereafter, referred to as 'pMOS') transistor is connected to a high-potential power supply, the source electrode of an n-channel MOS (hereafter, referred to as 'nMOS') transistor is connected to a low-potential power supply, and the respective drain electrodes of the p-MOS transistor and the nMOS transistor are connected.

The present invention allows configuration of a small circuit commonly used as a read-out circuit and a write-in circuit in a semiconductor memory device, which includes a resistance change element that varies in resistance due to the direction in which a voltage is applied.

[First Embodiment]

As shown in FIG. 1, a basic structure of a semiconductor memory device according to the first embodiment of the present invention includes: a first node 1 and a second node 2; a first MIS transistor P1 through which a first conductive carrier flows as a main current and which has a drain electrode on the first conductive carrier outflow side connected to the second node 2, a source electrode on the first conductive carrier inflow side connected to a first high-potential power supply $V_{DD}$, and a gate electrode connected to the first node 1; a second MIS transistor N1 through which a second conductive carrier flows as a main current, and which has a drain electrode on the second conductive carrier outflow side connected to the second node 2, a source electrode on the second conductive carrier inflow side connected to a second low-potential power supply $V_{SS}$, and a gate electrode connected to the first node 1; and a resistance change element Rv1 connected between the first node 1 and the second node 2, and varies in resistance due to the direction in which a voltage is applied.

According to the basic circuit structure of the semiconductor memory device of the first embodiment of the present invention, a read-out operation is performed by applying a low input voltage Vi when Rh–Rpo>0 and Rl–Rpo<0, while a read-out operation is performed by, applying a high input voltage Vi when Rh–Rno>0 and Rl–Rno<0. Rh denotes a high resistance of the resistance change element Rv1, and Rl denotes a low resistance thereof, Rno and Rpo denote on-resistances of the pMOS transistor P1 and nMOS transistor N1, respectively. In addition, the larger the respective absolute values, the larger the difference between a high and a low output voltage Vo.

Use of the circuit structure of the semiconductor memory device according to the first embodiment of the present invention shown in FIG. 1 allows configuration of a small circuit for a read-out operation when using the two-terminal resistance change element Rv1 as a memory element. In addition, when the resistance of the resistance change element Rv1 can be varied due to the direction in which a voltage is applied, use of the basic circuit shown in FIG. 1 also allows a write-in operation and achieves of a compact semiconductor memory device.

(Read-Out Operational Mode)

(Read-Out Operation)

Figure 2:
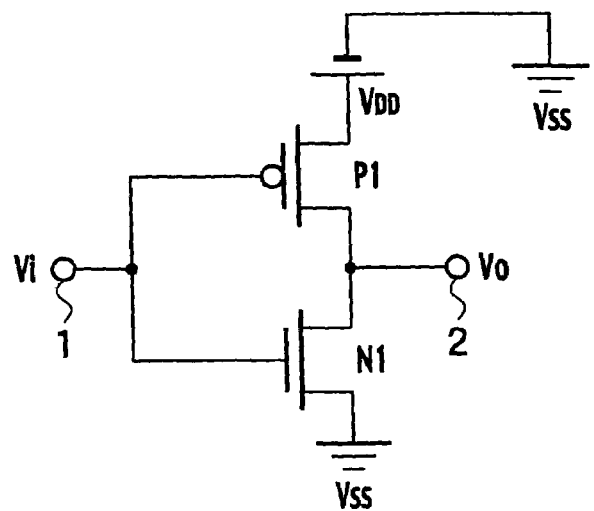
FIG. 2 shows a basic circuit structure of FIG. 1 having a resistance change element in a high resistance state.
Figure 3:
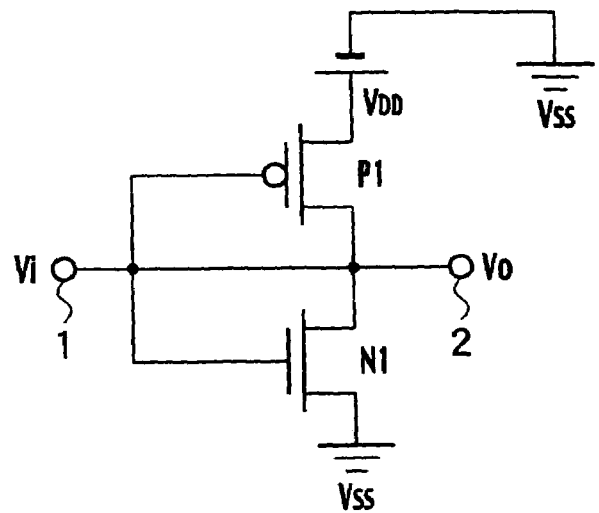
FIG. 3 shows the basic circuit structure of FIG. 1 having a resistance change element in a low resistance state.

As shown in FIG. 2, when the resistance change element Rv1 is in a high resistance state, the basic circuit of the semiconductor memory device, according to the first embodiment of the present invention, operates in the same manner as an inverter. That is an input value is inverted and the resulting value is then output. On the other hand, as shown in FIG. 3, when the resistance change element Rv1 is in a low resistance state, the basic circuit of the semiconductor memory device, according to the first embodiment of the present invention, can be regarded as being in a state where the input side is conductively coupled to the output side. Therefore, the output voltage Vo, which is the same as the input voltage Vi, is output. Here, 'high resistance state' of the resistance change element Rv1 means that the value of the resistance of Rv1 is higher than the value of the on-resistance of the first MIS transistor P1 including with the contact resistance when the first MIS transistor P1 is conducting during turned-on. In the same way, 'low resistance state' of the resistance change element Rv1 means that the value of the resistance of Rv1 is lower than the value of the on-resistance of the second MIS transistor N1 including with the contact resistance when the second MIS transistor N1 is conducting during turned-on.

Figure 4:
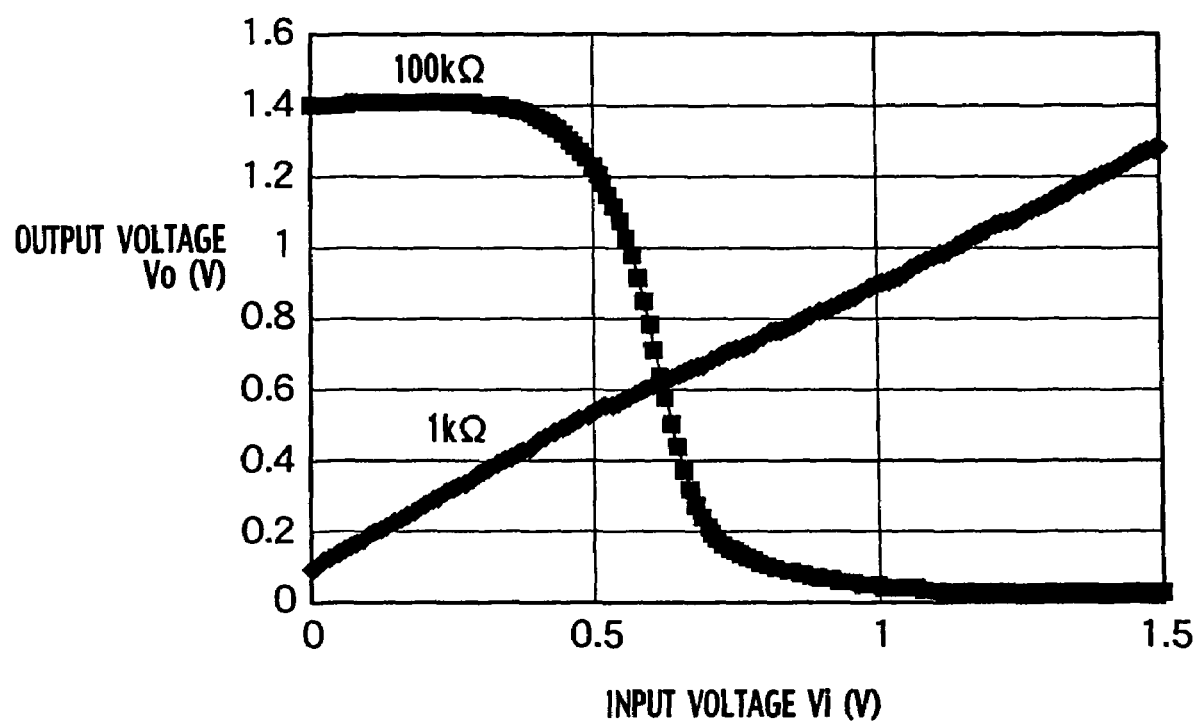
FIG. 4 shows circuit simulation results or output voltages Vo when applying input voltages Vi to a FIG. 5A is a diagram showing application of a low level input to the basic circuit structure of the semiconductor memory device, according to the first embodiment of the present invention, resulting in a voltage being applied to a resistance change element Rv1 in the direction from the output side to the input side.

FIG. 4 shows the results of carrying out a circuit simulation of the basic circuit of the semiconductor memory device, according to the first embodiment of the present invention, for the cases of the resistance of the resistance change element Rv1 being 1 k$\Omega$ and 100 k$\Omega$, respectively. The results show that there is a clear difference in relationship between input voltages Vi and corresponding output voltages Vo due to the resistance of the resistance change element Rv1. The circuit simulation results shown in FIG. 4 are obtained through a calculation assuming that: the channel lengths L of the respective first and the second MIS transistor: P1 and N1 are 0.11 $\mu$m; the respective channel widths thereof are 0.3 $\mu$m; and the power supply voltage $V_{DD}$ is 1.5 V.

According to FIG. 4, information on the resistance change element Rv1 can be read out by applying a low or a high input voltage Vi and then reading difference in output voltage Vo.

When the input voltage Vi is either low or high, either the first MIS transistor P1 or the second MIS transistor N1 turns on, and the other MIS transistor turns off. Therefore, assuming that an on-off ratio of the first MIS transistor P1 and the second MIS transistor N1 is sufficiently large and that the off-resistance is infinite, the output voltage Vo is equal to voltage at the junction between the resistance change element Rv1 and an activated MIS transistor (P1 or N1) connected in series. Accordingly, when using a resistance element only for reading out information such as with a read only memory (ROM), a MIS transistor (P1 or N1) and the resistance change element Rv1 connected in series may be provided.

(Write-In Operational Mode)

(Write-In Operation)

When using the basic circuit of the semiconductor memory device, according to the first embodiment of the present invention, for a write-in operation, the resistance change element Rv1 having two terminals is assumed to be an element that varies in resistance due to the direction in which a voltage is applied between terminals. Well-known elements are: an element that uses ionic conduction in a solid electrolyte material such as $Cu_2S$ or an Ag-rich Ag—Ge—Se based chalcogenide material, an element that uses Rotaxane or other molecular materials or an organic material such as a device having a structure sandwiching a metallic layer in an insulating film, and an element that uses a CMR material such as $Pr_{0.7}Ca_{0.3}MnO_3$, or an oxide.

Figure 5A:
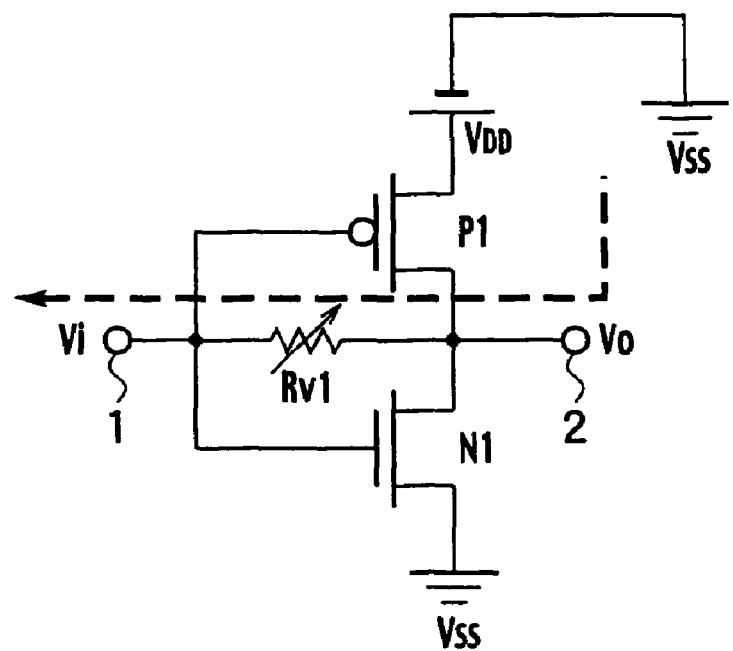
FIG. 5B is a diagram showing application of a high level input to the basic circuit structure of the semiconductor memory device, according to the first embodiment of the present invention, resulting in a voltage being applied to a resistance change element Rv1 in the direction from the first electrode side to the second electrode side.

When the input voltage Vi is low, the pMOS transistor P1 turns on and the nMOS transistor N1 turns off. Therefore, as shown in FIG. 5A, a voltage is applied to the resistance change element Rv1 in the direction from the second electrode side to the first electrode side.

Figure 5B:
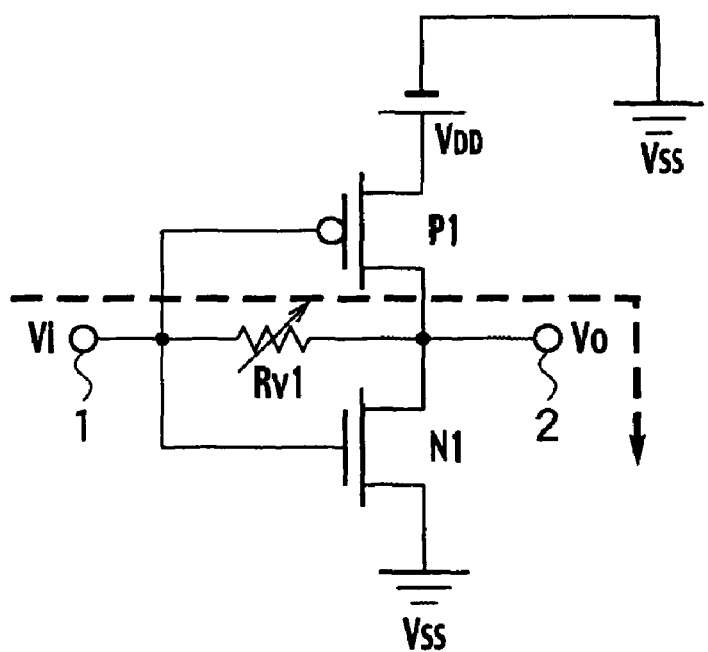

On the other hand, when the input voltage Vi is high, the pMOS transistor P1 turns off and the nMOS transistor N1 turns on. Therefore, as shown in FIG. 5B, a voltage is applied to the resistance change element Rv1 in the direction from the first electrode side to the second electrode side.

Information can be written in a resistance change element utilizing that difference in the direction in which voltage is applied.

Typically, a read-out voltage and a write-in voltage of a resistance change element are different. In such a case, a high level voltage to be applied to the first node 1 can be changed via a buffer. Alternatively, the power supply voltage $V_{DD}$ may be changed, and a power supply write-in voltage is used.

The basic structure of the semiconductor memory device, according to the first embodiment of the present invention, allows configuration of a small circuit commonly used as a read-out circuit and a write-in circuit of the semiconductor memory device, which includes a resistance change element that varies in resistance due to the direction in which a voltage is applied.

FIRST MODIFIED EXAMPLE OF THE FIRST EMBODIMENT

Figure 6:
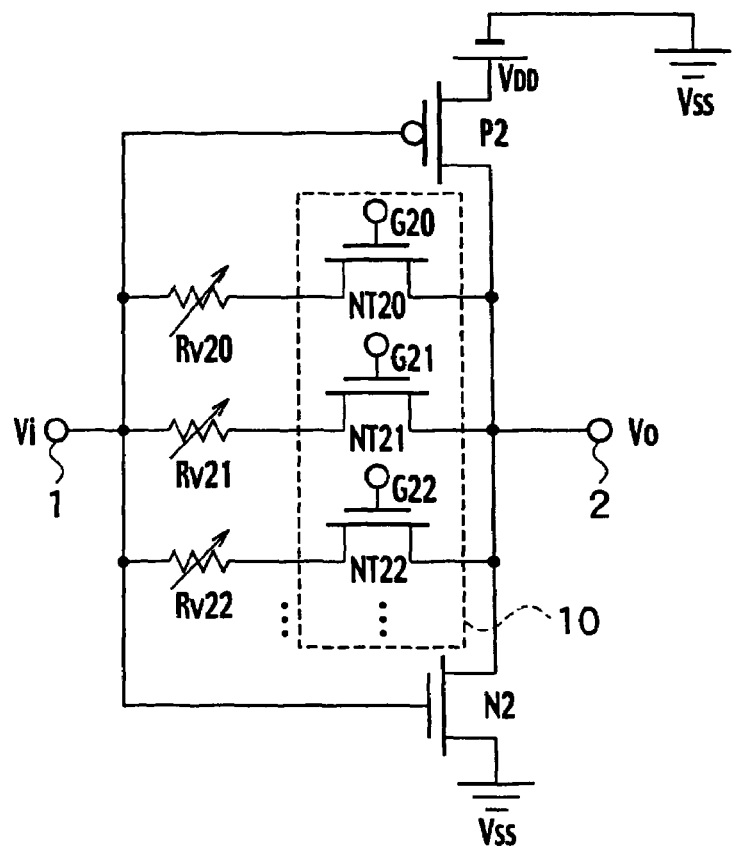
FIG. 6 shows a basic circuit structure of a semiconductor memory device, according to a first modified example of the first embodiment of the present invention.

As shown in FIG. 6, a basic structure of a semiconductor memory device, according to the first modified example of the first embodiment of the present invention, includes: a first node 1 and a second node 2; a first MIS transistor P2 through which a first conductive carrier flows as a main current and which has a drain electrode on the first conductive carrier outflow side connected to the second node 2, a source electrode on the first conductive carrier inflow side connected to a first high-potential power supply $V_{DD}$, and a gate electrode connected to the first node 1; a second MIS transistor N2 through which a second conductive carrier flows as a main current, and which has a drain electrode on the second conductive carrier outflow side connected to the second node 2, a source electrode on the second conductive carrier inflow side connected to a second low-potential power supply $V_{SS}$, and a gate electrode connected to the first node; multiple resistance change elements Rv20, Rv21, Rv22, . . . , which are disposed between the first node 1 and the second node 2 and vary in resistance due to a direction in which voltage is applied; and multiple select MIS transistors NT20, NT21, NT22, . . . , which are disposed between the first node 1 and the second node 2 and are connected in series with the multiple resistance change elements Rv20, Rv21, Rv22, . . . , respectively.

Figure 7:
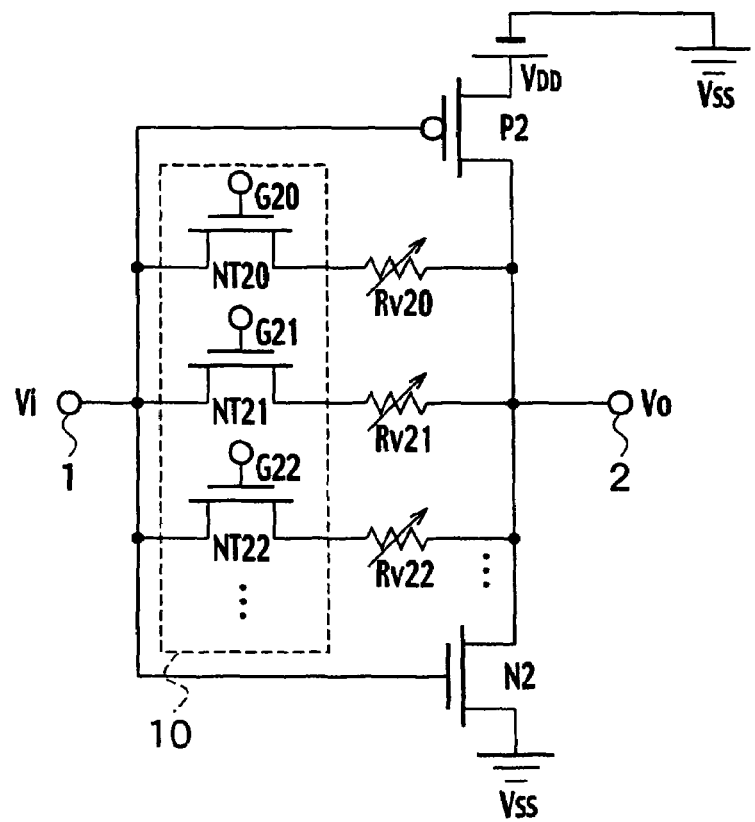
FIG. 7 shows another basic circuit structure of a semiconductor memory device, according to the first modified example of the first embodiment of the present invention.

In an example of FIG. 6, the select MIS transistors NT20, NT21, NT22, . . . are each connected between the second node 2 and respective resistance change elements Rv20, Rv21, Rv22, . . . Alternatively, as shown in FIG. 7, the select transistors NT20, NT21, NT22, . . . may each be connected between the first node 1 and respective resistance change elements Rv20, Rv21, Rv22, . . . As shown in FIG. 6, a select transistor block 10 is made up of the select MIS transistors NT20, NT21, NT22, . . . .

According to the circuit structure shown in FIG. 6 or FIG. 7, information can be read out from and written in one resistance change element selected from resistance change elements Rv20, Rv21, Rv22, . . . by selecting one of the gate electrodes G20, G21, G22, . . . of the select MIS transistors NT20, NT21, NT22, . . . and turning on the selected one of the select MIS transistors.

FIG. 6 shows an example of the select MIS transistors NT20, NT21, NT22, . . . , which are nMOS transistors. Alternatively, pMOS transistors may also be used. Alternatively, switching elements, which can be fabricated through substantially the same fabrication process as that for the resistance change elements Rv20, Rv21, Rv22, . . . , may be used, since they are connected in series with the resistance change elements Rv20, Rv21, Rv22, . . . , respectively.

Typically, a read-out voltage and a write-in voltage of a resistance change element are different from each other. Such a problem can be solved by changing a high level voltage using a buffer or by changing the power supply voltage $V_{DD}$. Alternatively, according to the first modified example of the first embodiment of the present invention, the problem can be solved by changing the gate voltage of a select MIS transistor so as to change the voltage applied to both ends of a resistance change element. In other words, even when the power supply voltage is fixed, selection of a resistance change element according to a gate voltage for a read-out operation that is smaller than the gate voltage for a write-in operation increases the on-resistance of the select transistor, resulting in a decrease in partial pressure applied to both ends of that resistance change element.

Note that according to the first modified example, a circuit is designed so that a high resistance of a resistance change element is Rh'Rh+Rso and a low resistance thereof is Rl'Rl+Rso; where: Rh denotes a high resistance of a resistance change element; Rl denotes a low resistance thereof; and Rso denotes an on-resistance of a select transistor.

The basic structure of the semiconductor memory device, according to the first modified example of the first embodiment of the present invention, allows configuration of a small circuit commonly used as a read-out circuit and a write-in circuit of the semiconductor memory device, which includes resistance change elements that vary in resistance due to the direction in which a voltage is applied. In addition, configuration of select MIS transistors connected in series with the multiple resistance change elements respectively allows selection of an arbitrary resistance change element through a select operation by the select MIS transistors and application to multifunctional uses.

SECOND MODIFIED EXAMPLE OF THE FIRST EMBODIMENT

According to the basic circuit structure of the semiconductor memory device of the first embodiment of the present invention shown in FIG. 1, a voltage corresponding to the resistance of the resistance change element Rv1 is continuously output when applying the first high-potential power supply $V_{DD}$. When the basic circuit of the semiconductor memory device, according to the first embodiment of the present invention, is used for applications with low power consumption, a circuit that latches output values may be connected to the subsequent stage.

Figure 8:
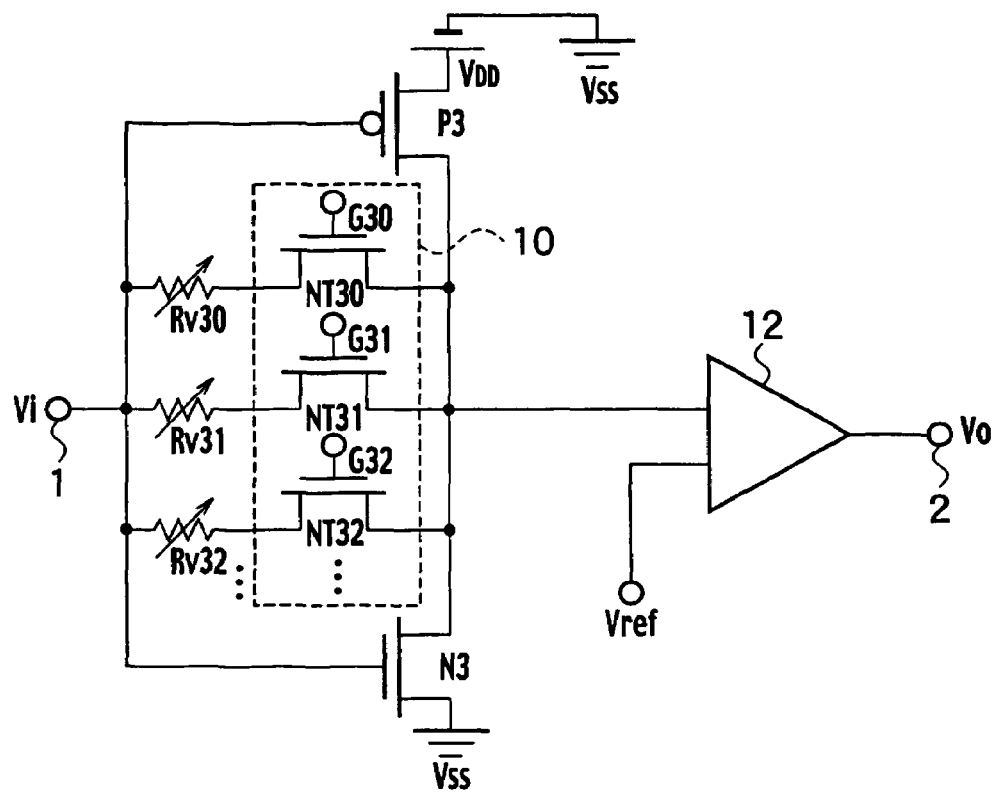
FIG. 8 shows a basic circuit structure of a semiconductor memory device, according to a second modified example of the first embodiment of the present invention.

As shown in FIG. 8, a basic structure of a semiconductor memory device, according to the second modified example of the first embodiment of the present invention, includes: a first node 1 and a second node 2; a first MIS transistor P3 through which a first conductive carrier flows as a main current and which has a drain electrode on the first conductive carrier outflow side connected to the second node 2 via a sense amplifier 12, a source electrode on the first conductive carrier inflow side connected to a first high-potential power supply $V_{DD}$, and a gate electrode connected to the first node; a second MIS transistor N3 through which a second conductive carrier flows as a main current and which has a drain electrode on the second conductive carrier outflow side connected to the drain electrode of the first MIS transistor P3, a source electrode on the second conductive carrier inflow side connected to a second low-potential power supply $V_{SS}$, and a gate electrode connected to the first node; multiple resistance change elements Rv30, Rv31, Rv32, . . . , which are disposed between the: first node 1 and the drain electrodes, respectively, and vary in resistance due to the direction in which a voltage is applied; and multiple select MIS transistors NT30, NT31, NT32, . . . , which are disposed between the first node 1 and the drain electrodes, respectively, and are connected in series with the multiple resistance change elements Rv30, Rv31, Rv32, . . . , respectively.

As shown in FIG. 8, the sense amplifier 12 is disposed in a subsequent stage of an inverter, and compares the inverted output voltage at the drain electrodes with the reference voltage $V_{ref}$ so as to latch a value. The inverted output voltage is amplified by the sense amplifier 12, providing the resulting output voltage Vo at the second node 2. Typically, the reference voltage $V_{ref}$ may be half the power supply voltage. Alternatively, the sense amplifier 12 may operate as a differential pair, which compares the inverted output voltage with the value of a memory cell.

The basic structure of the semiconductor memory device, according to the second modified example of the first embodiment of the present invention, allows configuration of a small circuit commonly used as a read-out circuit and a write-in circuit of the semiconductor memory device, which includes resistance change elements that vary in resistance due to the direction in which a voltage is applied. In addition, configuration of select MIS transistors connected in series with the multiple resistance change elements, respectively, allows selection of an arbitrary resistance change element through a select operation by the select MIS transistors and application to multifunctional uses. More specifically, inclusion of a sense amplifier circuit provides a semiconductor memory device with low power consumption.

THIRD MODIFIED EXAMPLE OF THE FIRST EMBODIMENT

When the basic circuit structure of the semiconductor memory device according to the first embodiment of the present invention shown in FIG. 1 provides a large enough difference between a high level and a low level inverted output voltage allowing a CMOS logic circuit to run, and also provides a sufficient driving force for driving a subsequent stage, the high level and the low level inverted output voltage values can be retained by connecting a latch circuit without using the reference voltage $V_{ref}$.

Figure 9:
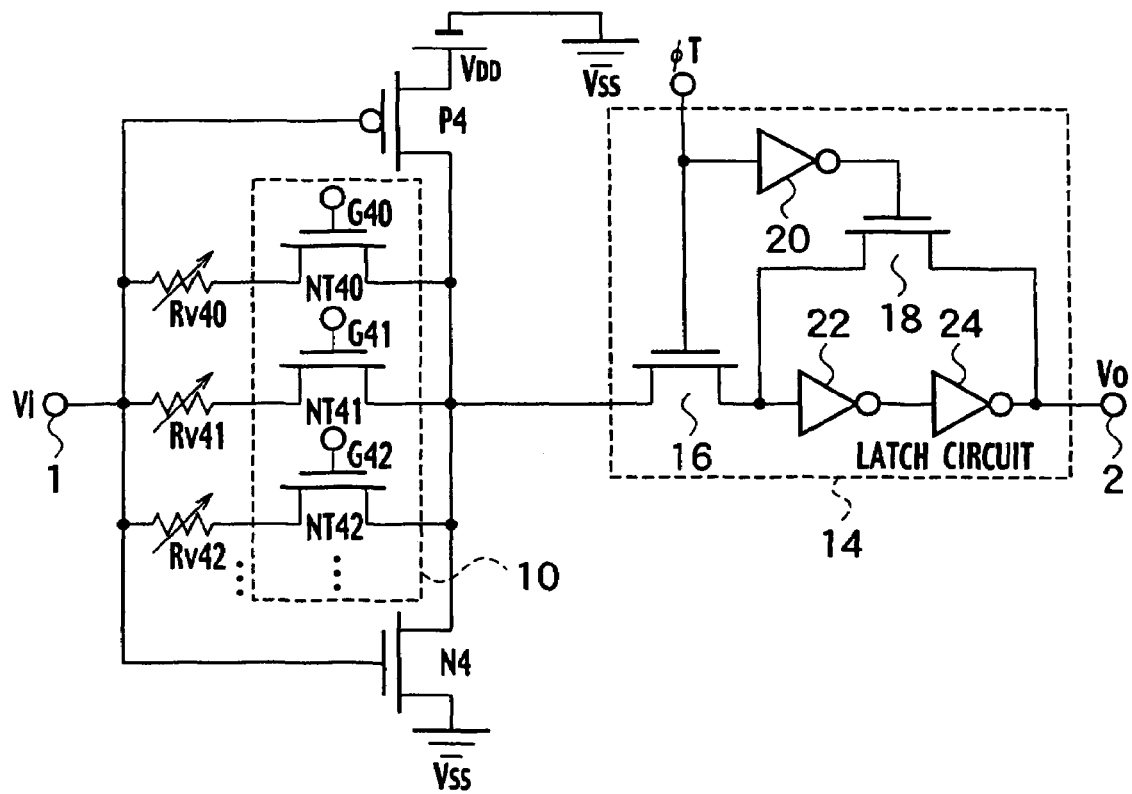
FIG. 9 shows a basic circuit structure of a semiconductor memory device, according to a third modified example of the first embodiment of the present invention.

As shown in FIG. 9, a basic structure of a semiconductor memory device, according to the third modified example of the first embodiment of the present invention, includes: a first node 1 and a second node 2; a first MIS transistor P4 through which a first conductive carrier flows as a main current and which has a drain electrode on the first conductive carrier outflow side connected to the second node 2 via a latch circuit 14, a source electrode on the first conductive carrier inflow side connected to a first high-potential power supply $V_{DD}$, and a gate electrode connected to the first node; a second MIS transistor N4 through which a second conductive carrier flows as a main current and which has a drain electrode on the second conductive carrier outflow side connected to the drain electrode of the first MIS transistor P4, a source electrode on the second conductive carrier inflow side connected to a second low-potential power supply $V_{SS}$, and a gate electrode connected to the first node; multiple resistance change elements Rv40, Rv41, Rv42, . . . , which are disposed between the first node 1 and the drain electrodes, respectively, and vary in resistance due to the direction in which a voltage is applied; and multiple select MIS transistors NT40, NT41, NT42, . . . , which are disposed between the first node 1 and the drain electrodes, respectively, and are connected in series with the multiple resistance change elements Rv40, Rv41, Rv42, . . . , respectively.

As shown in FIG. 9, the latch circuit 14 is disposed in a subsequent stage of the inverter, and an inverted output voltage at the drain electrode is directly latched. The inverted output voltage is amplified by the latch circuit 14, and the second node 2 provides the resulting output voltage Vo.

As shown in FIG. 9, the latch circuit 14 is made up of nMOS transistors 16 and 18 and inverters 20, 22, and 24. A select signal "$_T$" for the latch circuit 14 is synchronized with input signals that enter the gate electrodes G40, G41, G42, . . . of the select MIS transistors NT40, NT41, NT42, . . . . At a time of selecting one of the select MIS transistors NT40, NT41, NT42, . . . , a MOS transistor 16 on the input side of the latch circuit 14 is turned on. Once inputting to that select transistor and the latch circuit 14 is completed, a high level and a low level inverted output voltage values are retained in the inverter loop of the latch circuit 14. The latch circuit 14 may be configured with a structure having the same function as that described above.

The basic structure of the semiconductor memory device, according to the third modified example of the first embodiment of the present invention, allows configuration of a small circuit commonly used as a read-out circuit and a write-in circuit of the semiconductor memory device, which includes resistance change elements that vary in resistance due to the direction in which a voltage is applied. In addition, configuration of select MIS transistors connected in series with the multiple resistance change elements, respectively, allows selection of an arbitrary resistance change element through a select operation by the select MIS transistors and application to multifunctional uses. More specifically, inclusion of a latch circuit provides a semiconductor memory device with low power consumption.

FOURTH MODIFIED EXAMPLE OF THE FIRST EMBODIMENT

When the basic circuit structure of the semiconductor memory device, according to the first embodiment of the present invention, shown in FIG. 1 provides a large enough difference between a high level and a low level output voltage allowing a CMOS logic circuit to run, and also provides a sufficient driving force for driving a subsequent stage, direct connection to a logic circuit is possible. For example, connection may be made via a buffer.

Figure 10:
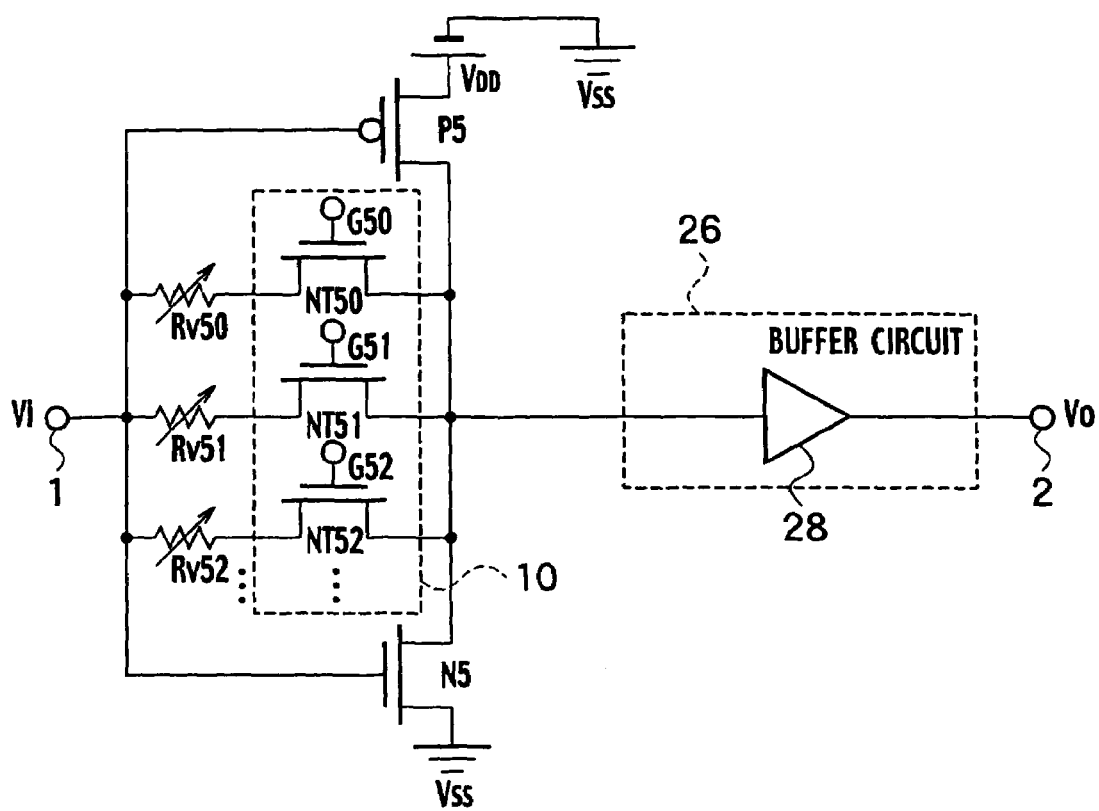
FIG. 10 shows a basic circuit structure of a semiconductor memory device, according to a fourth modified example of the first embodiment of the present invention.

As shown in FIG. 10, a basic structure of a semiconductor memory device, according to the fourth modified example of the first embodiment of the present invention, includes: a first node 1 and a second node 2; a first MIS transistor P5 through which a first conductive carrier flows as a main current and which has a drain electrode on the first conductive carrier outflow side connected to the second node 2 via a buffer circuit 26, a source electrode on the first conductive carrier inflow side connected to a first high-potential power supply $V_{DD}$, and a gate electrode connected to the first node; a second MIS transistor N5 through which a second conductive carrier flows as a main current and which has a drain electrode on the second conductive carrier outflow side connected to the drain electrode of the first MIS transistor P5, a source electrode on the second conductive carrier inflow side connected to a second low-potential power supply $V_{SS}$, and a gate electrode connected to the first node;

multiple resistance change elements Rv50, Rv51, Rv52, ..., which are disposed between the first node 1 and the drain electrodes, respectively and vary in resistance due to the direction in which a voltage is applied; and multiple select MIS transistors NT50, NT51, NT52, ..., which are disposed between the first node 1 and the drain electrodes, respectively and are connected in series with the multiple resistance change elements Rv50, Rv51, Rv52, ..., respectively.

As shown in FIG. 10, the buffer circuit 26 is disposed in a subsequent stage of the inverter, and reproduces and amplifies the inverted output voltage from the drain electrode. The buffer circuit 26 reproduces and amplifies the inverted output voltage, and the second node 2 provides the resulting output voltage Vo.

As shown in FIG. 10, the buffer circuit 26 includes a buffer inverter 28. The buffer circuit 26 may be configured with a structure having the same function as that described above.

The basic structure of the semiconductor memory device, according to the fourth modified example of the first embodiment of the present invention, allows configuration of a small, circuit commonly used as a read-out circuit and a write-in circuit of the semiconductor memory device, which includes resistance change elements that vary in resistance due to the direction in which a voltage is applied. In addition, configuration of select MIS transistors connected in series to the multiple resistance change elements, respectively allows selection of an arbitrary resistance change element through a select operation by the select MIS transistors and application to multifunctional uses. More specifically, inclusion of a buffer circuit provides a semiconductor memory device with low power consumption.

FIFTH MODIFIED EXAMPLE OF THE FIRST EMBODIMENT

When the basic circuit structure of the semiconductor memory device according to the first embodiment of the present invention shown in FIG. 1 provides a large enough difference between a high level and a low level output voltage allowing a CMOS logic circuit to run, and also provides a sufficient driving force for driving a subsequent stage, direct connection to a logic circuit is possible. For example, connection to a logic circuit via a flip flop is possible.

Figure 11:
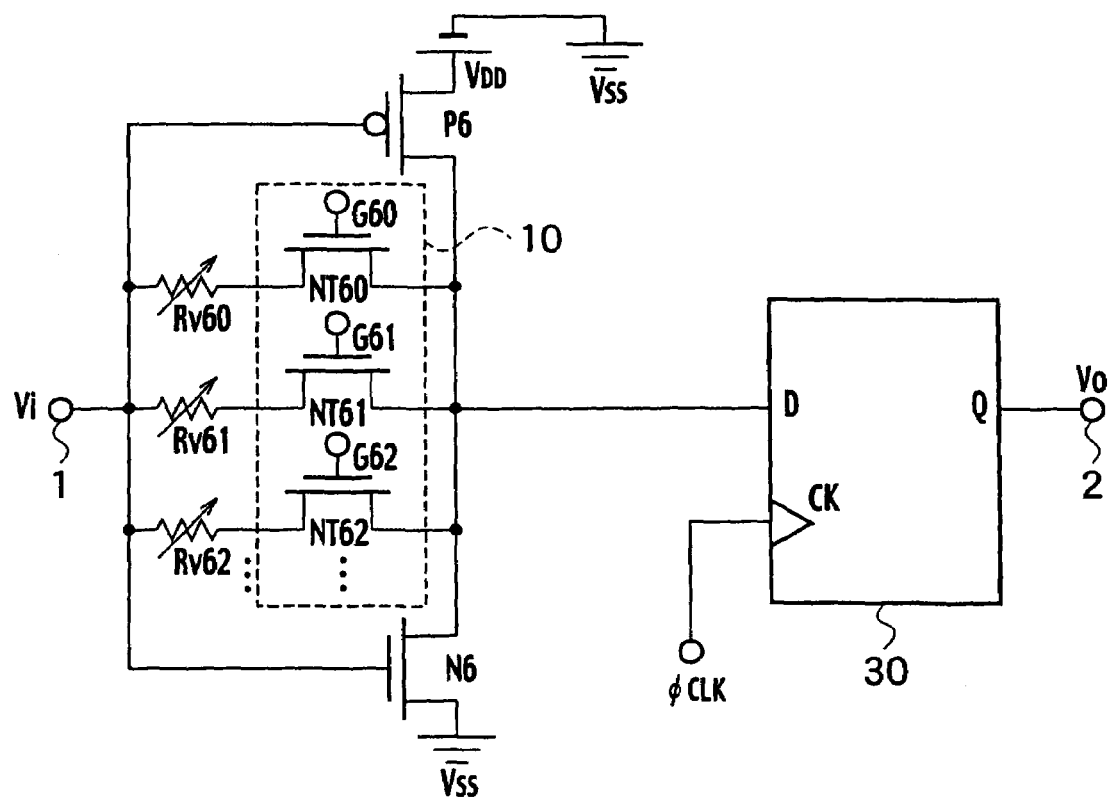
FIG. 11 shows a basic circuit structure of a semiconductor memory device, according to a fifth modified example of the first embodiment of the present invention.

As shown in FIG. 11, a basic structure of a semiconductor memory device, according to the fifth modified example of the first embodiment of the present invention, includes: a first node 1 and a second node 2; a first MIS transistor P6 through which a first conductive carrier flows as a main current and which has a drain electrode on the first conductive carrier outflow side connected to the second node 2 via a flip flop 30, a source electrode on the first conductive carrier inflow side connected to a first high-potential power supply $V_{DD}$, and a gate electrode connected to the first node 1; a second MIS transistor N6 through which a second conductive carrier flows as a main current and which has a drain electrode on the second conductive carrier outflow side connected to the drain electrode of the first MIS transistor P6, a source electrode on the second conductive carrier inflow side connected to a second low-potential power supply $V_{SS}$, and a gate electrode connected to the first node 1; multiple resistance change elements Rv60, Rv61, Rv62, ..., which are disposed between the first node 1 and the drain electrodes, respectively, and vary in resistance due to the direction in which a voltage is applied; and multiple select MIS transistors NT60, NT61, NT62, ..., which are disposed between the first node 1 and the drain electrodes, respectively, and are connected in series with the multiple resistance change elements Rv60, Rv61, Rv62, ..., respectively.

As shown in FIG. 11, a flip-flop 30 is disposed in a subsequent stage of the inverter, and reproduces and amplifies the inverted output voltage at the drain electrode. The flip-flop 30 reproduces and amplifies the inverted output voltage, and the second node 2 provides the resulting output voltage Vo.

As shown in FIG. 11, the flip-flop 30 is a D flip-flop that inputs a clock input signal $_{\prime\prime CLK}$. The flip-flop 30 may be configured with a flip-flop structure having the same function as that described above.

The basic structure of the semiconductor memory device, according to the fifth modified example of the first embodiment of the present invention, allows configuration of a small circuit commonly used as a read-out circuit and a write-in circuit of the semiconductor memory device, which includes resistance change elements that vary in resistance due to the direction in which a voltage is applied. In addition, configuration of select MIS transistors connected in series with the multiple resistance change elements, respectively, allows selection of an arbitrary resistance change element through a select operation by the select MIS transistors and application to multifunctional uses. More specifically, inclusion of a flip-flop provides a semiconductor memory device with low power consumption.

SIXTH MODIFIED EXAMPLE OF THE FIRST EMBODIMENT

The basic circuit structure of the semiconductor memory device, according to the first embodiment of the present invention, shown in FIG. 1 allows a small circuit to carry out a write-in and a read-out operation. Therefore, use of the basic circuit structure for a reconfigurable logic with large capacitance memory is effective. For example, a circuitry shown in FIG. 12 can be used to form a look up table 34 in a semiconductor memory device.

Figure 12:
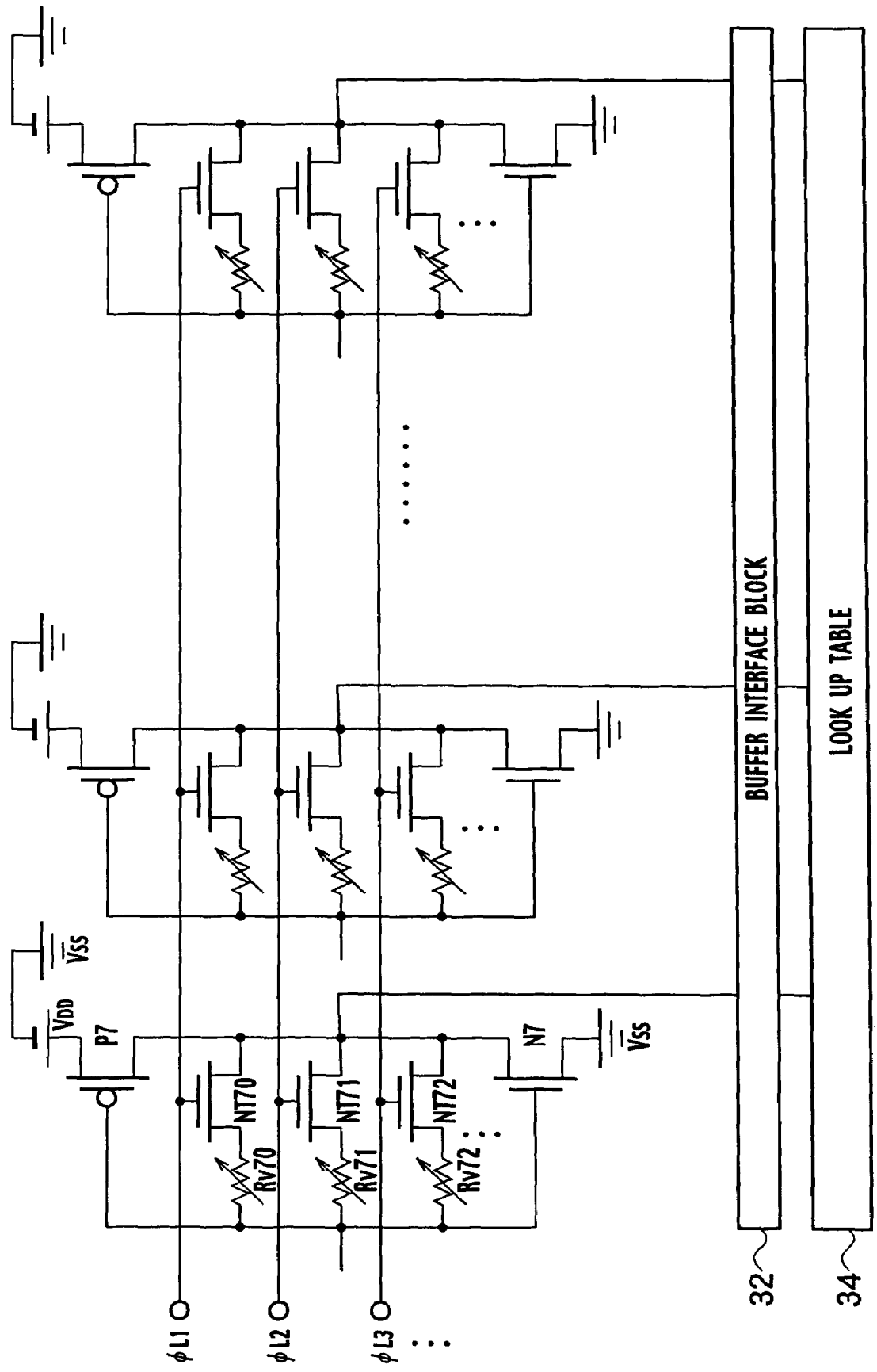
FIG. 12 schematically shows a structure of a semiconductor memory device, according to a sixth modified example of the first embodiment of the present invention.

As shown in FIG. 12, a semiconductor memory device, according to the sixth modified example of the first embodiment of the present invention, includes: the look up table 34; a buffer interface block 32, which is connected to the look up table 34; and a CMOS inverter-based semiconductor memory block, which includes multiple resistance change elements exemplified in FIG. 6 and is connected to the buffer interface block 32.

As shown in FIG. 12, a semiconductor memory-device having multiple resistance change elements includes: a first node and a second node; a first MIS transistor P7 through which a first conductive carrier flows as a main current and which has a drain electrode on the first conductive carrier outflow side connected to the second node, a source electrode on the first conductive carrier inflow side connected to a first high-potential power supply $V_{DD}$, and a gate electrode connected to the first node; a second MIS transistor N7 through which a second conductive carrier flows as a main current and which has a drain electrode on the second conductive carrier outflow side connected to the second node, a source electrode on the second conductive carrier inflow side connected to a second low-potential power supply $V_{SS}$, and a gate electrode connected to the first node; multiple resistance change elements Rv70, Rv71, Rv72, ..., which are connected between the first node and the second node, respectively, and vary in resistance due to the direction in which a voltage is applied; multiple select MIS transistors NT70, NT71, NT72, . . . , which are disposed between the first node and the second node, and are connected in series with the multiple resistance change elements Rv70, Rv71, Rv72, . . . , respectively; and look up table select signals "$_{L1}$, "$_{L2}$, "$_{L3}$, . . . , which are coupled to the gate electrodes of the multiple select MIS transistors NT70, NT71, NT72, . . . , respectively.

The look up table select signals "$_{L1}$, "$_{L2}$, "$_{L3}$, . . . allow selection of a look up table (LUT) element 1, a LUT element 2, a LUT element 3, . . . , respectively, each being in a different configuration of the look up table 34, so as to write in and read out data, which corresponds to respective resistances of the resistance change elements Rv70, Rv71, Rv72, . . . .

The basic structure of the semiconductor memory device, according to the sixth modified example of the first embodiment of the present invention, allows configuration of a small circuit commonly used as a read-out circuit and a write-in circuit of the semiconductor memory device, which includes resistance change elements that vary in resistance due to the direction in which a voltage is applied, and application of a large capacitance memory to a reconfigurable logic.

SEVENTH MODIFIED EXAMPLE OF THE FIRST EMBODIMENT

Figure 13:
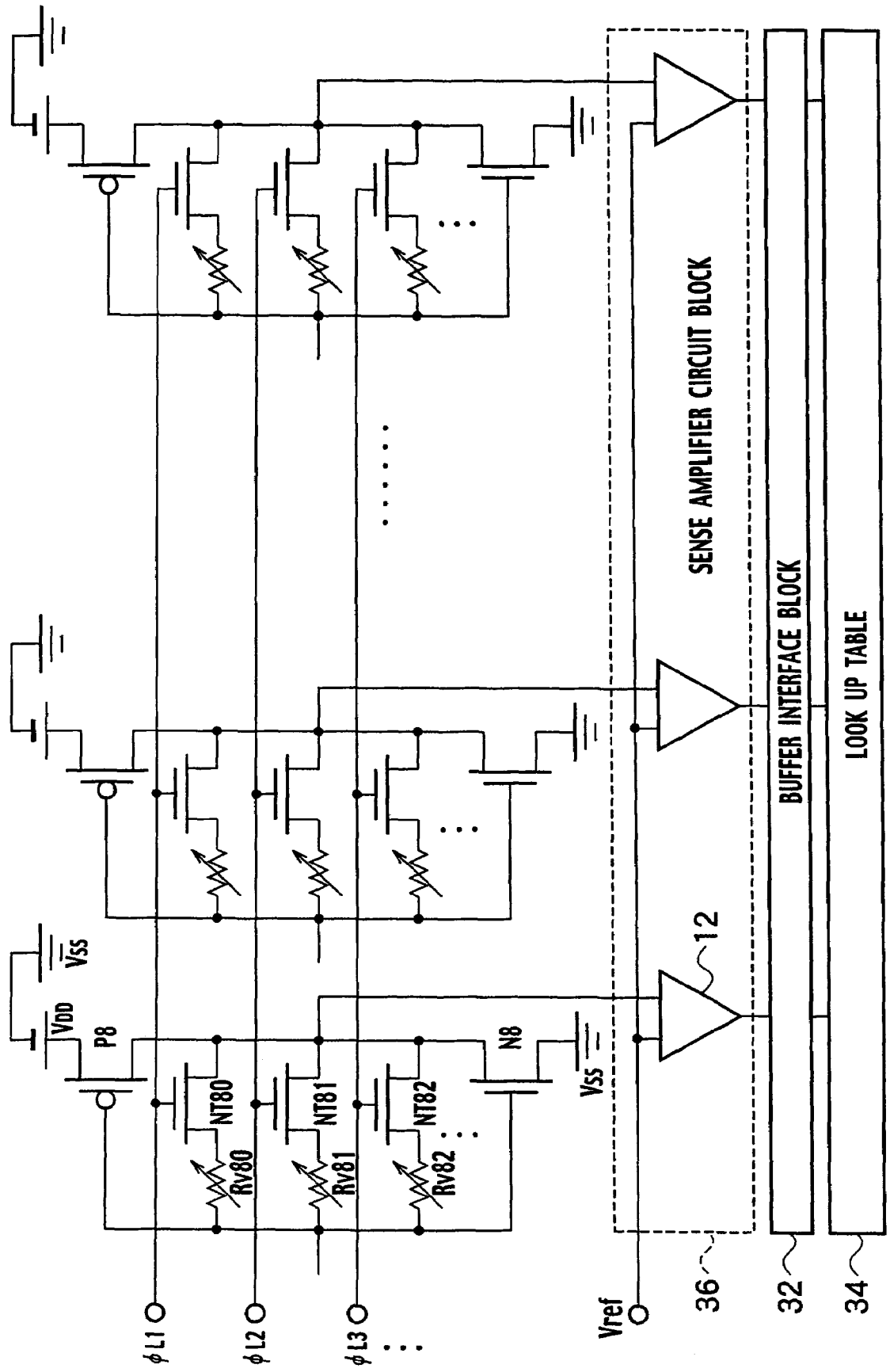
FIG. 13 schematically shows a structure of a semiconductor memory device, according to a seventh modified example of the first embodiment of the present invention.

As shown in FIG. 13, a semiconductor memory device, according to the seventh modified example of the first embodiment of the present invention, includes: a look up table 34; a buffer interface block 32, which is connected to the look up table 34; a sense amplifier block 36, which is connected to the buffer interface block 32; and a CMOS inverter based semiconductor memory block, which is connected to the sense amplifier block 36 and includes multiple resistance change elements exemplified in FIG. 6.

As shown in FIG. 13, a semiconductor memory device having multiple resistance change elements includes: a first node and a second node; a first MIS transistor P8 through which a first conductive carrier flows as a main current and which has a drain electrode on the first conductive carrier outflow side connected to the second node, a source electrode on the first conductive carrier inflow side connected to a first high-potential power supply $V_{DD}$, and a gate electrode connected to the first node; a second MIS transistor N8 through which a second conductive carrier flows as a main current and which has a drain electrode on the second conductive carrier outflow side connected to the second node, a source electrode on the second conductive carrier inflow side connected to a second low-potential power supply $V_{SS}$, and a gate electrode connected to the first node; multiple resistance change elements Rv80, Rv81, Rv82, . . . , which are connected between the first node and the second node and vary in resistance due to the direction in which a voltage is applied; multiple select MIS transistors NT80, NT81, NT82, . . . , which are disposed between the first node and the second node and are connected in series with the multiple resistance change elements Rv80, Rv81, Rv82, . . . , respectively; and look up table select signals "$_{L1}$, "$_{L2}$, "$_{L3}$, . . . , which are coupled to the gate electrodes of the multiple select MIS transistors NT80, NT81, NT82, . . . , respectively.

The look up table select signals "$_{L1}$, "$_{L2}$, "$_{L3}$, . . . are used to select a look up table (LUT) element 1, a LUT element 2, a LUT element 3, . . . , respectively, each being in a different configuration of the look up table 34 so as to write in and read out data, which corresponds to respective resistances of the resistance change elements Rv80, Rv81, Rv82, . . .

The basic structure of the semiconductor memory device, according to the seventh modified example of the first embodiment of the present invention, allows configuration of a small circuit commonly used as a read-out circuit and a write-in circuit of the semiconductor memory device, which includes resistance change elements that vary in resistance due to the direction in which a voltage is applied, and application of a large capacitance memory to a reconfigurable logic.

EIGHTH MODIFIED EXAMPLE OF THE FIRST EMBODIMENT

Figure 14:
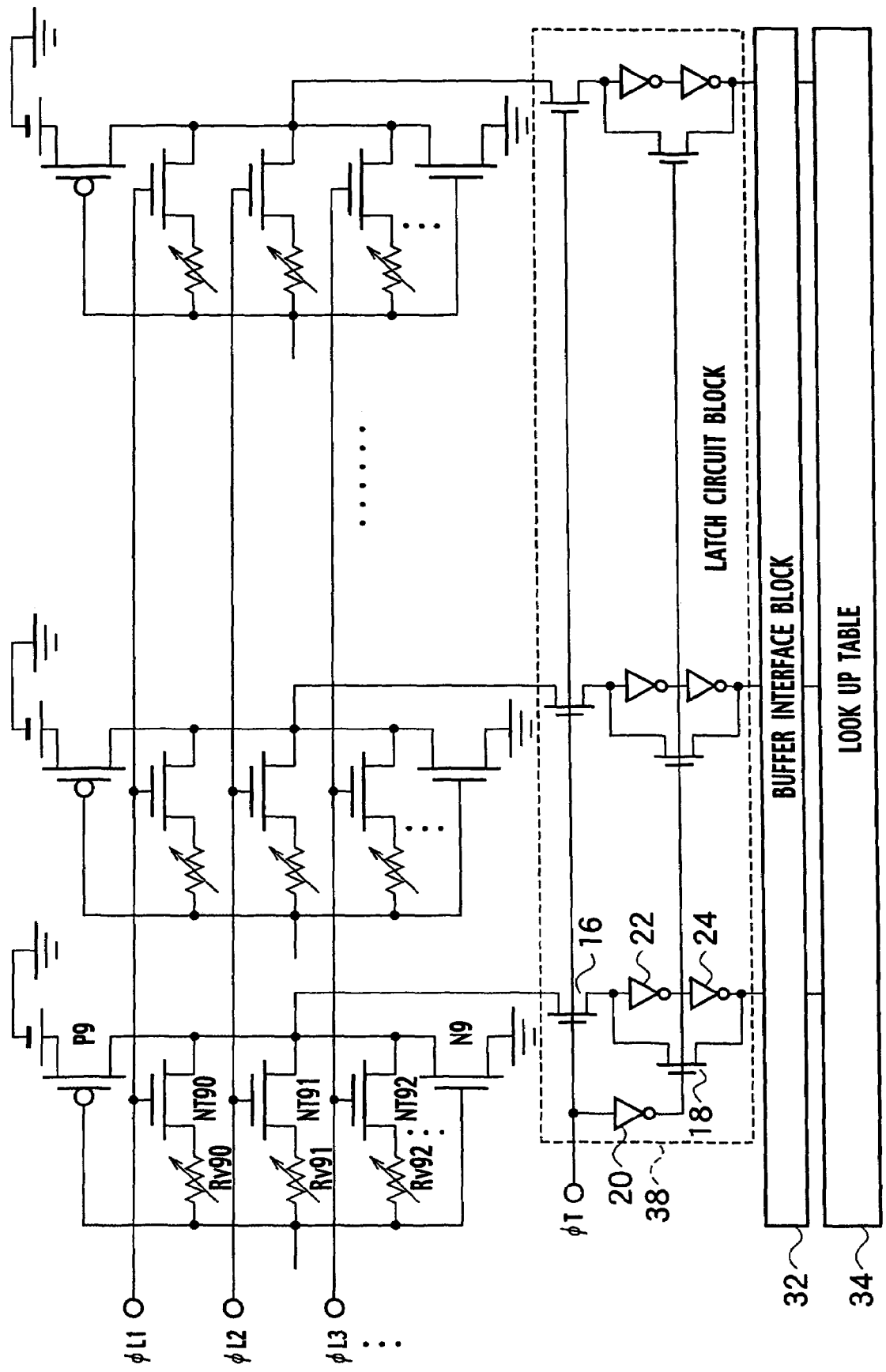
FIG. 14 schematically shows a structure of a semiconductor memory device, according to an eighth modified example of the first embodiment of the present invention.

As shown in FIG. 14, a semiconductor memory device, according to the eighth modified example of the first embodiment of the present invention, includes: a look up table 34, a buffer interface block 32, which is connected to the look up table 34; a latch circuit block 38, which is connected to the buffer interface block 32; and a CMOS inverter based semiconductor memory block, which is connected to the latch circuit block 38 and includes multiple resistance change elements exemplified in FIG. 6.

As shown in FIG. 14, a semiconductor memory device having multiple resistance change elements includes: a first node and a second node; a first MIS transistor P9 through which a first conductive carrier flows as a main current and which has a drain electrode on the first conductive carrier outflow side connected to the second node, a source electrode on the first conductive carrier inflow side connected to a first-high-potential power supply $V_{DD}$, and a gate electrode connected to the first node; a second MIS transistor N9 through which a second conductive carrier flows as a main current and which has a drain electrode on the second conductive carrier outflow side connected to the second node, a source electrode on the second conductive carrier inflow side connected to a second low-potential power supply $V_{SS}$, and a gate electrode connected to the first node; multiple resistance change elements Rv90, Rv91, Rv92, . . . , which are connected between the first node and the second node and vary in resistance due to the direction in which a voltage is applied; multiple select MIS transistors NT90, NT91, NT92, . . . , which are disposed between the first node and the second node and are connected in series with the multiple resistance change elements Rv90, Rv91, Rv92, . . . , respectively; and look up table select signals "$_{L1}$, "$_{L2}$, "$_{L3}$, . . . , which are coupled to the gate electrodes of the multiple select MIS transistors NT90, NT91, NT92, . . . , respectively.

The look up table select signals "$_{L1}$, "$_{L2}$, "$_{L3}$, . . . are used to select a look up table (LUT) element 1, a LUT element 2, a LUT element 3, . . . , respectively, each being in a different configuration of the look up table 34, so as to write-in and read-out data, which corresponds to respective resistances of the resistance change elements Rv90, Rv91, Rv92, . . .

The basic structure of the semiconductor memory device, according to the eighth modified example of the first embodiment of the present invention, allows configuration of a small circuit commonly used as read-out circuit and a write-in circuit in the semiconductor memory device, which includes resistance change elements that vary in resistance due to the direction in which a voltage is applied, and application of a large capacitance memory to a reconfigurable logic.

NINTH MODIFIED EXAMPLE OF THE FIRST EMBODIMENT

Figure 15:
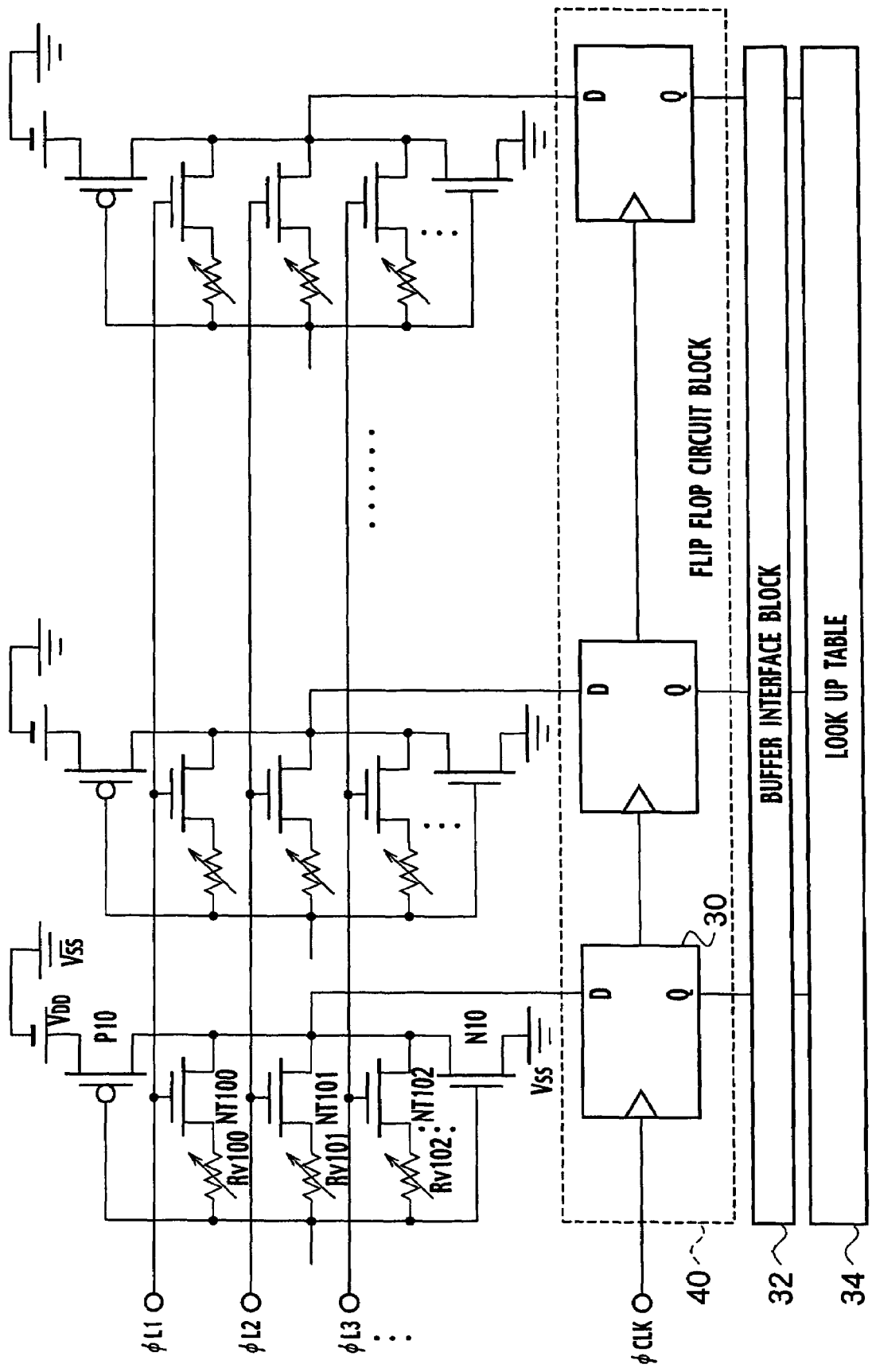
FIG. 15 schematically shows a structure of a semiconductor memory device, according to a ninth modified example of the first embodiment of the present invention.

As shown in FIG. 15, a semiconductor memory device, according to the ninth modified example of the first embodiment of the present invention, includes: a look up table 34; a buffer interface block 32, which is connected to the look up table 34; a flip flop circuit block 40, which is connected to the buffer interface block 32; and a CMOS inverter based semiconductor memory device, which is connected to the flip flop circuit block 40 and includes multiple resistance change elements exemplified in FIG. 6.

As shown in FIG. 15, a semiconductor memory device having multiple resistance change elements includes: a first node and a second node; a first MIS transistor P10 through which a first conductive carrier flows as a main current and which has a drain electrode on the first conductive carrier outflow side connected to the second node, a source electrode on the first conductive carrier inflow side connected to a first high-potential power supply $V_{DD}$, and a gate electrode connected to the first node; a second MIS transistor N10 through which a second conductive carrier flows as a main current and which has a drain electrode on the second conductive carrier outflow side connected to the second node, a source electrode on the second conductive carrier inflow side connected to second low-potential power supplies $V_{SS}$, and gate electrodes connected to the first node; multiple resistance change elements Rv100, Rv101, Rv102, . . . , which are connected between the first node and the second node and vary in resistance due to the direction in which a voltage is applied; multiple select MIS transistors NT100, NT101, NT102, . . . , which are disposed between the first node and the second node and are connected in series with the multiple resistance change elements Rv100, Rv101, Rv102, . . . , respectively; and look up table select signals $"_{L1}, "_{L2}, "_{L3}, \ldots$, which are coupled to the gate electrodes of the multiple select MIS transistors NT100, NT101, NT102, . . . , respectively.

The look up table select signals $"_{L1}, "_{L2}, -_{L3}, \ldots$, are used to select look up table (LUT) element 1, LUT element 2, LUT element 3, . . . , respectively, each being in a different configuration of the look up table 34, so as to write-in and read-out data, which corresponds to respective resistances of the resistance change elements Rv100, Rv101, Rv102, . . .

The basic structure of the semiconductor memory device, according to the ninth modified example of the first embodiment of the present invention, allows configuration of a small circuit commonly used as a read-out circuit and a write-in circuit in the semiconductor memory device, which includes resistance change elements that vary in resistance due to the direction in which a voltage is applied, and application of a large capacitance memory to a reconfigurable logic.

[Second Embodiment]

Figure 16:
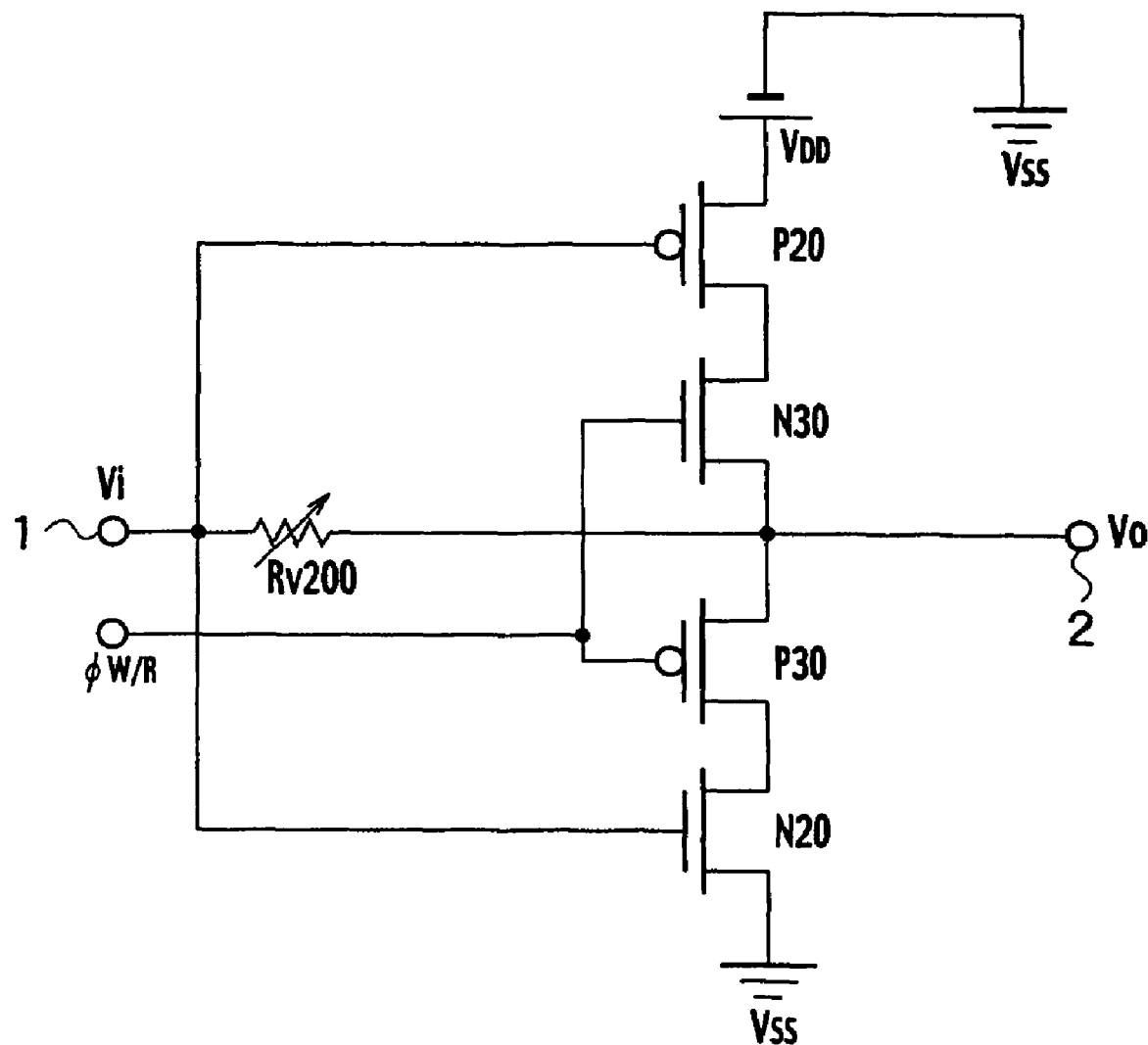
FIG. 16 shows a basic circuit structure of a semiconductor memory device, according to a second embodiment of the present invention.

As shown FIG. 16, a semiconductor memory device, according to the second embodiment of the present invention, includes: a first node 1, a second node 2 and a switching node to which a write-in/read-out switching signal $"_{W/R}$ is input; a first MIS transistor P20 through which a first conductive carrier flows as a main current and which has a source electrode on the first conductive carrier inflow side connected to a first high-potential power supply $V_{DD}$ and a gate electrode connected to the first node 1; a second MIS transistor N20 through which a second conductive carrier flows as a main current and which has a source electrode on the second conductive carrier inflow side connected to a second low-potential power supply $V_{SS}$ and a gate electrode connected to the first node 1; a third MIS transistor P30 having electrodes, one of which is connected to the drain electrode on the second conductive carrier outflow side of the second MIS transistor N20 and the other is connected to the second node 2, and a gate electrode connected to the switching node; a fourth MIS transistor N30 having electrodes, one of which is connected to the drain electrode on the first conductive carrier outflow side of the first MIS transistor P20 and the other is connected to the second node 2, and a gate electrode connected to the switching node; and a resistance change element Rv200, which is connected between the first node 1 and the second node 2 and varies in resistance due to the direction in which a voltage is applied.

More specifically, when the third MIS transistor P30 is a pMOS transistor and the fourth MIS transistor N30 is an nMOS transistor, as shown in FIG. 16, the semiconductor memory device, according to the second embodiment of the present invention, includes: a first MIS transistor P20 through which a first conductive carrier flows as a main current; a second MIS transistor N20 through which a second conductive carrier flows as a main current; a third MIS transistor P30 through which a first conductive carrier flows as a main current; a fourth MIS transistor N30 through which a second conductive carrier flows as a main current; a second node 2, which is commonly connected to the respective source electrodes on the first conductive carrier inflow side of the third MIS transistor P30 and on the second conductive carrier inflow side of the fourth MIS transistor N30; a first node 1, which is commonly connected to the respective gate electrodes of the first MIS transistor P20 and the second MIS transistor N20; a switching node, which is commonly connected to the respective gate electrodes of the third MIS transistor P30 and the fourth MIS transistor N30, and to which a write-in/read-out switching signal $"_{W/R}$ is input; a first high-potential power supply $V_{DD}$, which is connected to the source electrode on the first conductive carrier inflow side of the first MIS transistor P20; a second low-potential power supply $V_{SS}$, which is connected to the source electrode on the second conductive carrier inflow side of the second MIS transistor N20; and a resistance change element Rv200, which is disposed between the first node 1 and the second node 2, and varies in resistance due to the direction in which a voltage is applied. The respective drain electrodes on the first conductive charier outflow side of the third MIS transistor P30 and on the second conductive carrier outflow side of the second MIS transistor are connected to each other, and the respective drain electrodes on the second conductive carrier outflow side of the fourth MIS transistor N30 and on the first conductive carrier outflow side of the first MIS transistor P20 are connected to each other.

In other words, the nMOS transistor N30 is disposed between the pMOS transistor P1 and the resistance change element Rv1 as in the first embodiment. The pMOS transistor P30 is disposed between the nMOS transistor N1 and the resistance change element Rv1, and the respective gates of the disposed nMOS transistor N30 and the pMOS transistor P30 are connected to each other. Comparing FIG. 1 with FIG. 16, the pMOS transistor P1 in FIG. 1 corresponds to the pMOS transistor P20, the nMOS transistor N1 corresponds to the nMOS transistor N20, and the resistance change element Rv1 corresponds to the resistance-change element Rv200.

Typically, a write-in voltage and a read-out voltage for a resistance change element are different from each other.

Therefore, according to the basic circuit structure of the semiconductor memory device of the first embodiment of the present invention shown in FIG. 1, two voltage sources, each supplying a different voltage, must be connected. On the other hand, according to the basic circuit structure of the semiconductor memory device of the second embodiment of the present invention, a single voltage source may be connected. This simplifies the circuit structure.

In FIG. 16, the interpositioned nMOS transistor N30 and pMOS transistor P30 are maintained in a normally-on state by controlling channel impurity concentration so as to adjust respective thresholds. In other words, a current must flow through transistors to a certain extent even when the source voltage and the gate voltage are the same. The power supply voltage $V_{DD}$ and the high input voltage Vdd may be set to be equal to or higher than the write-in voltage for the resistance change element Rv200.

(Read-Out Operational Mode)

(Read-Out Operation)

The write-in/read-out switching signal $"_{W/R}$ is set to a high level when setting the input voltage Vi to a high level and then reading out the output voltage Vo. On the other hand, the write-in/read-out switching signal $"_{W/R}$ is set to a low level when setting the input voltage Vi to a low level and then reading out the output voltage Vo.

Figure 17A:
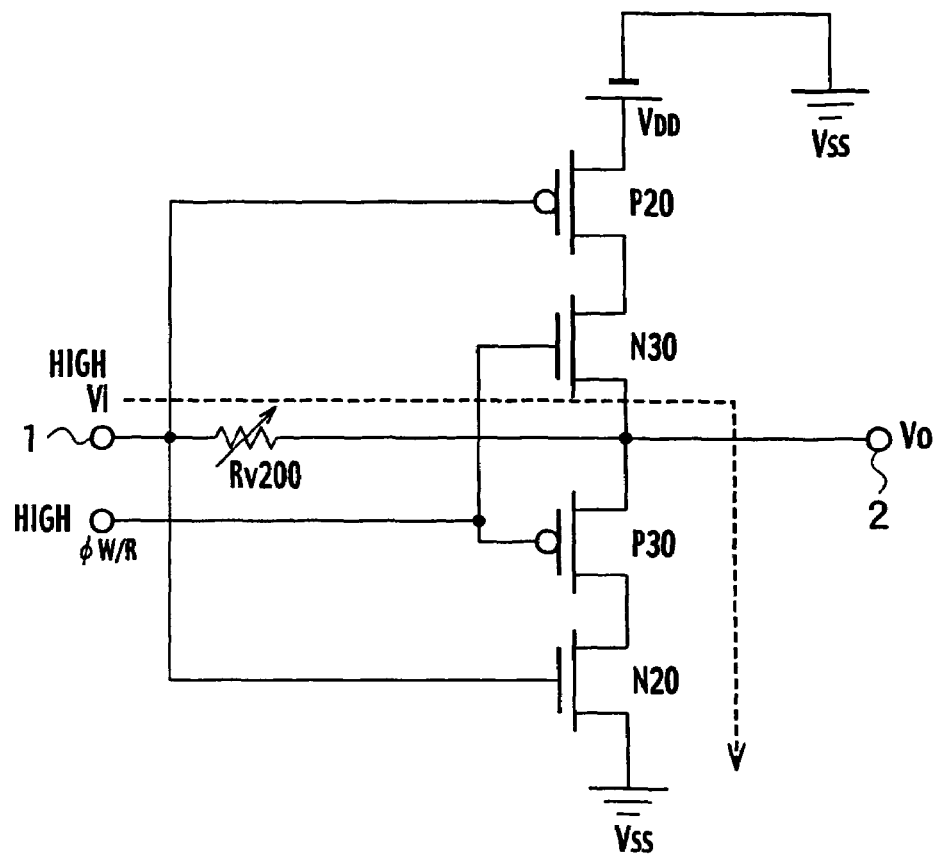
FIG. 17A is a diagram showing the direction in which a voltage is applied when applying a high voltage to a first node in the basic circuit structure of the semiconductor memory device, so as to read out, according to the second embodiment of the present invention.
Figure 17B:
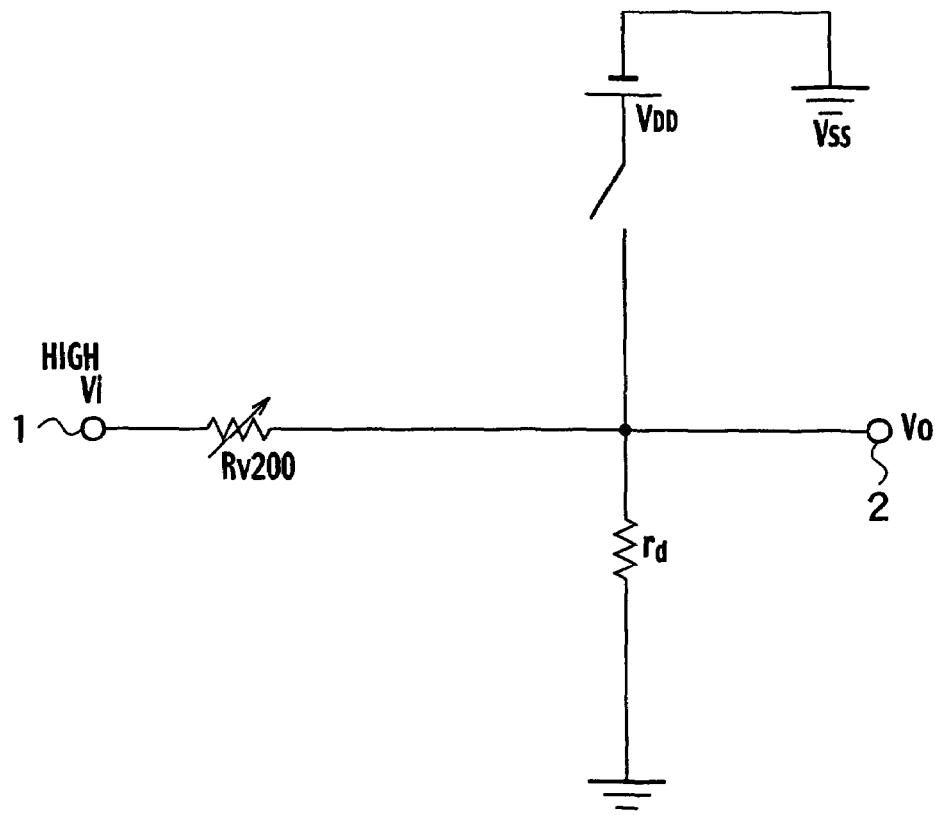
FIG. 17B is a schematic circuit equivalent to that of FIG. 17A, which corresponds to the basic circuit structure of the semiconductor memory device, according to the second embodiment of the present invention.

The case of setting the input voltage Vi to a high level and then reading out the output voltage Vo is described using FIGS. 17A and 17B. When a high level voltage is applied to the input voltage Vi, the pMOS transistor P20 turns off and the nMOS transistor N20 turns on. As shown by an arrow in FIG. 17A, a voltage is applied between the first node 1 and the ground $V_{SS}$ via the pMOS transistor P30 and the nMOS transistor N20. In this case, since a high level voltage is applied to the gate of the pMOS transistor P30, the pMOS transistor P30 is typically off. However, since the PMOS transistor P30 according to the second embodiment has normally-on characteristics, which are obtained by adjusting the threshold voltage, a current flows between the source and the drain of the PMOS transistor P30 even when a high level voltage is applied to the gate of the pMOS transistor P30.

FIG. 17B corresponds to a schematic equivalent circuit in FIG. 17A. If the on-resistance of the nMOS transistor N20 is negligible, the output voltage Vo at the second node 2 is based on the balance between the resistances of the change element Rv200 and the pMOS transistor P30. Since Vo=[$r_d$/(R+$r_d$)]×Vdd, ideally, the output voltage may be higher than the ground potential $V_{SS}$; where R denotes the resistance of the resistance change element Rv200, $r_d$ denotes the resistance of the pMOS transistor P30, and Vdd denotes a high level input voltage Vi. In this case, a voltage applied to both ends of the resistance change element Rv200 is [R/(R+$r_d$)]×Vdd. Accordingly, the threshold of the pMOS transistor P30 should be adjusted so that the value of [R/(R+$r_d$)]×Vdd can fall within the range of allowable read-out voltages.

In the case of setting the input voltage Vi to a low level and then reading out the output voltage Vo, the resistances of the PMOS transistor P20 and the nMOS transistor N30 for dividing voltage should be set, and the threshold of the nMOS transistor N30 should be adjusted so that a voltage applied to both ends of the resistance change element Rv200 can be equal to the read-out voltage.

(Write-In Operational Mode)

(Write-In Operation)

The write-in/read-out switching signal $"_{W/R}$ is set to a low level for a write-in operation when applying a high level voltage to the first node 1. The write-in/read-out switching signal $"_{W/R}$ is set to a high level for a write-in operation when applying a low level voltage to the first node 1.

Data corresponding to the resistance of the resistance change element Rv200 is written in response to an entered high or a low input voltage Vi.

Figure 18A:
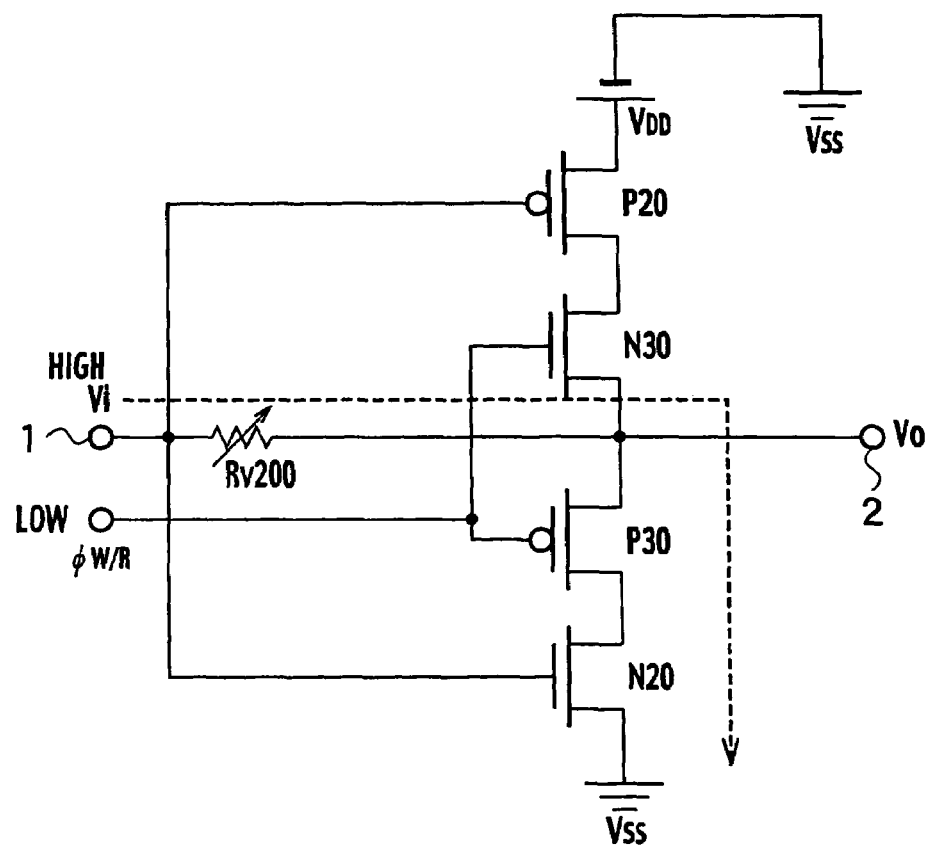
FIG. 18A is a diagram showing the direction in which a voltage is applied when applying a high voltage to a first node in the basic circuit structure of the semiconductor memory device, so as to write in, according to the second embodiment of the present invention.
Figure 18B:
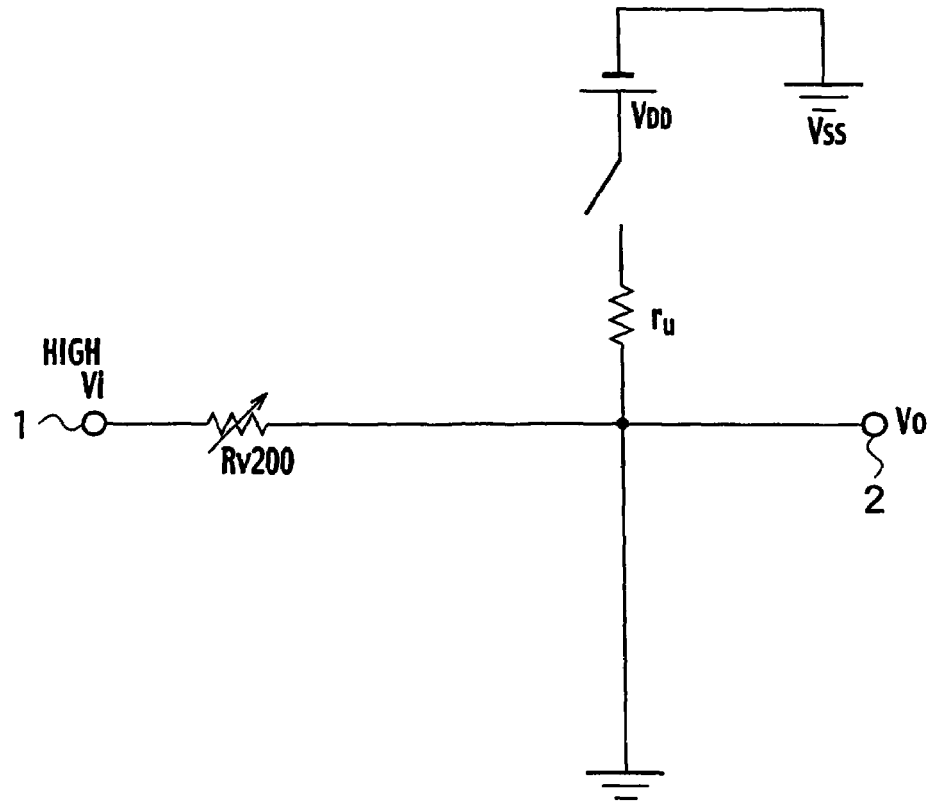
FIG. 18B is a schematic circuit equivalent to that of FIG. 18A, which corresponds to the basic circuit structure of the semiconductor memory device, according to the second embodiment of the present invention.

A case of applying a high level voltage to the first node 1 and then writing in is described using FIGS. 18A and 18B. When a high level voltage is applied to the first node 1, the pMOS transistor P20 turns off and the nMOS transistor N20 turns on. As shown by an arrow in FIG. 18A, a voltage is applied between the first node 1 and the ground $V_{SS}$ via the pMOS transistor P30 and the nMOS transistor N20.

FIG. 18B corresponds to a schematic equivalent circuit of FIG. 18A. Since a low level voltage of the write-in/read-out switching signal $"_{W/R}$ is applied to the gate of the PMOS transistor P30, the pMOS transistor P30 turns on. Therefore, if on-resistances of the nMOS transistor N20 and the PMOS transistor P30 are negligible for the resistance change element Rv200, the voltage applied to both ends of the resistance change element Rv200 is Vdd, and a write-in voltage can be applied; where Vdd denotes a high level voltage applied to the first node 1. In a case of inputting a low level voltage to the first node 1 and then writing in, setting the write-in/read-out switching signal $"_{W/R}$ to a high level so as to turn on the nMOS transistor N30 applies the power supply voltage. $V_{DD}$ to both ends of the resistance change element Rv200 via the pMOS transistor P20 and the nMOS transistor N30, resulting in data written in the resistance change element Rv200.

While the exemplary method of adjusting the threshold voltages of the pMOS transistor P30 and the nMOS transistor N30 through adjustment of channel impurity concentration has been described above, such adjustment can also be made by controlling a substrate bias. Alternatively, such adjustment can be made by adjusting the channel impurity concentration and controlling the substrate bias voltage. Alternatively, when an analog-like adjustment is needed for each element due to dispersion of element characteristics, an analog-like adjustment of the write-in/read-out switching signal $"_{W/R}$ and the substrate bias voltage controls the dispersion. In this case, the basic circuit of the semiconductor memory device, according to the second embodiment of the present invention, can run on a single power supply.

In addition, in the circuit structure shown in FIG. 16, the pMOS transistor P30 and the nMOS transistor N30 are disposed as shown in the drawing; however, alternatively, the positions of the pMOS transistor P30 and the nMOS transistor may be exchanged. Alternatively, only a nMOS transistor N30 or only a pMOS transistor P30 may be used for configuration. In this case, however, naturally, the relationship between the input signal value and the write-in/read-out switching signal $"_{W/R}$ value must be changed. In short, a transistor disposed along a voltage applied route must be turned off during a read-out operation. On the other hand, the write-in/read-out switching signal is controlled so that a transistor disposed in a voltage applied route can be turned on for a write-in operation. In addition, off resistances of the pMOS transistor P30 and the nMOS transistor N30 are adjusted so that the read-out voltage can be applied to the resistance change element Rv200 during a read-out operation.

The basic structure of the semiconductor memory device, according to the second embodiment of the present invention, allows configuration of a small circuit commonly used as a read-out circuit and a write-in circuit of the semiconductor memory device, which includes a resistance change element that varies in resistance due to the direction in which a voltage is applied. In addition, according to the basic circuit structure of the semiconductor memory device of the second embodiment of the present invention, a single voltage source may be connected. This simplifies the circuit structure.

[Other Embodiments]

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation.

Various modifications will become possible for those skilled in the art after receiving the teachings of the present disclosure without departing from the scope thereof.

What is claimed is:

1. A semiconductor memory comprising:
   a first node and a second node;
   a first MIS transistor, having first conductive carrier flows, including a source electrode connected to a first power supply, a drain electrode connected to the second node, and a gate electrode connected to the first node;
   a second MIS transistor, having second conductive carrier flows, including a source electrode connected to a second power supply, a drain electrode connected to the second node, and a gate electrode connected to the first node; and
   a resistance change element connected between the first node and the second node and having a variable resistance due to the direction in which a voltage is applied,
   wherein information is written in the resistance change element by applying a voltage between the first and the second node, and stored information is read out by applying a low or high voltage to the first node and reading out a voltage difference in the second node.

2. The semiconductor memory of claim 1, wherein a high resistance of the resistance change element is higher than an on-resistance of the first MIS transistor or the second MIS transistor, and a low resistance of the resistance change element is lower than the on-resistance of the first MIS transistor or the second MIS transistor.

3. The semiconductor memory of claim 1, further comprising a sense amplifier connected to the second node.

4. The semiconductor memory of claim 1, further comprising a latch circuit connected to the second node.

5. The semiconductor memory of claim 1, further comprising a logic circuit connected to the second node.

6. The semiconductor memory of claim 1, wherein the resistance change element is one of an Ag—Ge—Se based chalcogenide, $Cu_2S$, Rotaxane, an organic material, a colossal magneto resistive (CMR) material such as $Pr_{0.7}Ca_{0.3}MnO_3$, or an oxide material.

7. A semiconductor memory comprising:
   a first node and a second node;
   a first MIS transistor, having first conductive carrier flows, including a source electrode connected to a first power supply, a drain electrode connected to the second node, and a gate electrode connected to the first node;
   a second MIS transistor, having second conductive carrier flows, including a source electrode connected to a second power supply, a drain electrode connected to the second node, and a gate electrode connected to the first node;
   a plurality of resistance change element connected between the first node and the second node and having a variable resistance due to the direction in which a voltage is applied; and
   a plurality of select transistors disposed between the first node and the second node and connected in series with the plurality of resistance change elements, respectively,
   wherein information is written in the resistance change element by applying a voltage between the first and the second node, and stored information is read out by applying a low or high input voltage to the first node and reading out a voltage difference in the second node.

8. The semiconductor memory of claim 7, wherein one of the terminals of the plurality of resistance change elements is connected to the first node, and one of the terminals of the plurality of select transistors is connected to the second node.

9. The semiconductor memory of claim 7, wherein one of the terminals of the plurality of select transistors is connected to the first node, and one of the terminals of the plurality of resistance change elements is connected to the second node.

10. The semiconductor memory of claim 7, wherein a combined resistance of a high resistance of the resistance change element and an on-resistance of the select transistor is higher than the on-resistance of the first MIS transistor or the second MIS transistor, and a combined resistance of a low resistance and the on-resistance of the select transistor is lower than the on-resistance of the first MIS transistor or the second MIS transistor.

11. The semiconductor memory of claim 7, further comprising a sense amplifier connected to the second node.

12. The semiconductor memory of claim 7, further comprising a latch circuit connected to the second node.

13. The semiconductor memory of claim 7, further comprising a logic circuit connected to the second node.

14. The semiconductor memory of claim 7, further comprising:
   a buffer interface connected to the second node; and
   a look up table connected to the buffer interface.

15. The semiconductor memory of claim 7, further comprising:
   a sense amplifier connected to the second-node;
   a buffer interface connected to the sense amplifier; and
   a look up table connected to the buffer interface.

16. The semiconductor memory of claim 7, further comprising:
   a latch circuit connected to the second node;
   a buffer interface connected to the latch circuit; and
   a look up table connected to the buffer interface.

17. The semiconductor memory of claim 7, further comprising:
   a flip flop circuit connected to the second node;
   a buffer interface connected to the flip flop circuit; and
   a look up table connected to the buffer interface.

18. The semiconductor memory of claim 7, wherein the resistance change element is one of an Ag—Ge—Se based chalcogenide, $Cu_2S$, Rotaxane, an organic material, a colossal magneto resistive (CMR) material such as $Pr_{0.7}Ca_{0.3}MnO_3$, or an oxide material.

19. A semiconductor memory comprising:
a first node, a second node, and a switching node;
a first MIS transistor, having first conductive carrier flows, including a source electrode connected to a first power supply, and a gate electrode connected to the first node;
a second MIS transistor, having second conductive carrier flows, including a source electrode connected to a second power supply, and a gate electrode connected to the first node;,
a third MIS transistor, having first conductive carrier flows, having electrodes, one of which is connected to a drain electrode of the second MIS transistor, and another electrode connected to the second node, and a gate electrode connected to the switching node;
a fourth MIS transistor, having second conductive carrier flows, having electrodes, one of which is connected to a drain electrode of the first MIS transistor and another electrode connected to the second node, and a gate electrode connected to the switching node; and
a resistance change element connected between the first node and the second node and having a variable resistance due to the direction in which a voltage is applied,
wherein information is written in the resistance change element by applying a voltage between the first and the second node, and stored information is read out by applying a low or high input voltage to the first node and reading out a voltage difference in the second node.

20. The semiconductor memory of claim 19, wherein the resistance change element is one of an Ag—Ge—Se based chalcogenide material, $Cu_2S$, Rotaxane, an organic material, a colossal magneto resistive (CMR) material such as $Pr_{0.7}Ca_{0.3}MnO_3$, or an oxide material.

* * * * *